(12) United States Patent
Asauchi

(10) Patent No.: US 8,230,163 B2
(45) Date of Patent: Jul. 24, 2012

(54) MEMORY DEVICE, HOST CIRCUIT, CIRCUIT BOARD, LIQUID RECEPTACLE, METHOD OF TRANSMITTING DATA STORED IN A NONVOLATILE DATA MEMORY SECTION TO A HOST CIRCUIT, AND SYSTEM INCLUDING A HOST CIRCUIT AND A MEMORY DEVICE DETACHABLY ATTACHABLE TO THE HOST CIRCUIT

(75) Inventor: Noboru Asauchi, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 345 days.

(21) Appl. No.: 12/750,852

(22) Filed: Mar. 31, 2010

(65) Prior Publication Data

US 2010/0254201 A1 Oct. 7, 2010

(30) Foreign Application Priority Data

Apr. 1, 2009 (JP) ................................. 2009-088592

(51) Int. Cl.
*G06F 12/00* (2006.01)
(52) U.S. Cl. ................ 711/103; 711/102; 711/E12.001; 711/E12.002; 711/E12.103
(58) Field of Classification Search .................. 711/102, 711/103
See application file for complete search history.

(56) References Cited

U.S. PATENT DOCUMENTS

| | | | |
|---|---|---|---|
| 5,929,885 A | 7/1999 | Nakajima et al. | |
| 6,749,281 B2 | 6/2004 | Asauchi | |
| 6,984,012 B2 | 1/2006 | Asauchi | |
| 7,406,576 B2 * | 7/2008 | Asauchi | 711/163 |
| 7,840,748 B2 * | 11/2010 | Gower et al. | 711/105 |
| 2007/0250659 A1 * | 10/2007 | Booth et al. | 711/103 |
| 2009/0265602 A1 | 10/2009 | Nakano et al. | |

FOREIGN PATENT DOCUMENTS

| | | |
|---|---|---|
| JP | 02-068642 | 3/1990 |
| JP | 06-226989 | 8/1994 |
| JP | 06-303222 | 10/1994 |
| JP | 2001-146030 | 5/2001 |
| JP | 2002-370383 | 12/2002 |
| JP | 2003-112431 | 4/2003 |
| JP | 2004-074464 | 3/2004 |
| JP | 2004-299405 | 10/2004 |
| JP | 2009-259225 | 11/2009 |

* cited by examiner

*Primary Examiner* — Hoai V Ho
*Assistant Examiner* — Tri Hoang
(74) *Attorney, Agent, or Firm* — Stroock & Stroock & Lavan LLP

(57) ABSTRACT

A memory device is electrically connectable to a host circuit. The memory device includes a nonvolatile data memory section, a read/write control section, and a data transmission section. The read/write control section reads a first data from the nonvolatile data memory section where the first data has a prescribed data amount. The data transmission section transmits to the host circuit the first data together with second data, wherein the second data is different from the first data and has prescribed correlation with content of the first data. The second data having an identical data amount to the data amount of the first data.

21 Claims, 17 Drawing Sheets

MEMORY DEVICE, HOST CIRCUIT,
CIRCUIT BOARD, LIQUID RECEPTACLE,
METHOD OF TRANSMITTING DATA
STORED IN A NONVOLATILE DATA
MEMORY SECTION TO A HOST CIRCUIT,
AND SYSTEM INCLUDING A HOST CIRCUIT
AND A MEMORY DEVICE DETACHABLY
ATTACHABLE TO THE HOST CIRCUIT

CROSS-REFERENCE TO RELATED
APPLICATIONS

The present application claims the priority based on Japanese Patent Application No. 2009-088592 filed on Apr. 1, 2009, the disclosure of which is hereby incorporated by reference in their entirety.

BACKGROUND OF THE INVENTION

1. Field of the Invention

The present invention relates to a memory device, to a host circuit, to a circuit board, to a liquid receptacle, to a method of transmitting data stored in a nonvolatile data memory section to a host circuit, and to a system that includes a host circuit and a memory device detachably attachable to the host circuit.

2. Description of the Related Art

An inkjet printer, which is one example of a liquid ejecting device, typically has one or more installed ink receptacles or ink containers which are detachable liquid receptacles. Some ink receptacles are provided with memory devices. The memory device stores information of various kinds, for example, the remaining ink level or the color of the ink in the ink receptacle. A control unit provided to the printer communicates with the memory device of the ink receptacle.

JP-A 2002-370383
JP-A 2004-299405
JP-A 2001-146030
JP-A 6-226989
JP-A 2003-112431

However, in conventional techniques, insufficient consideration was given to the issue of dependability of communication between the control unit provided to the printer and the memory devices provided to the ink receptacles. For example, there is a risk that, for reasons such as faulty contact between the electrical contact portions of the printer and an ink receptacle, faulty communication may occur between the control unit provided to the printer and the memory device of the ink receptacle. If operation of the print control unit were to continue on with the faulty communication unresolved, there is a risk of problems such as errors being created in the memory contents of the memory device. This issue is not limited to memory devices provided to ink receptacles, but is rather an issue common to all manner of memory devices that electrically connect to a host circuit.

SUMMARY OF THE INVENTION

An object of the present invention is to provide a technology for improving dependability of communication with a host circuit in a memory device that is electrically connected to the host circuit.

The present invention is addressed to attaining the above objects at least in part according to the following aspects or modes of the present invention.

A first aspect of the present invention is directed to a memory device electrically connectable to a host circuit. The memory device includes a nonvolatile data memory section; a read/write control section that reads a first data from the nonvolatile data memory section, the first data having a prescribed data amount; and a data transmission section that transmits to the host circuit the first data together with second data, wherein the second data is different from the first data and has correlation with content of the first data, the second data having an identical data amount to the data amount of the first data.

With this arrangement, the host circuit can judge the communication condition by determining the correlation between the first data and the second data. As a result, dependability of communication between the host circuit and the memory device is enhanced.

In a second aspect of the present invention, the memory device further includes a data generation section that generates the second data using the first data. With this arrangement, the memory device can generate the second data using the first data.

In a third aspect of the present invention, the first data and the second data each are binary signals of n bits where n is an integer equal to or greater than 1, and the second data is inverted data that inverts each bit of the first data. With this arrangement, since the second data is inverted data of the first data, if, for example, only one level of the binary signals appears on the communication line due to communication errors, the host circuit can surely detect the communication errors.

In a fourth aspect of the present invention, the integer n is an even number, and the data transmission section transmits, in synchronism with a clock signal, an upper n/2 bits of the first data, an upper n/2 bits of the second data, a lower n/2 bits of the first data, and a lower n/2 bits of the second data, in that order.

In a fifth aspect of the present invention, the data transmission section additionally transmits to the host circuit third data that is substantially identical to the first data, and fourth data that is substantially identical to the second data. With this arrangement, the host circuit can continue processing using the fourth data even if the first data includes communication errors.

In a sixth aspect of the present invention, the nonvolatile data memory section has a first memory area for storing the first data, and a second memory area for storing the third data. With this arrangement, the host circuit can obtain the third data as correct data which is stored in the second memory area even if there are some memory defects in the first memory area.

In a seventh aspect of the present invention, the memory device further includes a data generation section that generate the second data from the first data, and to generate the fourth data from the third data. With this arrangement, the host circuit can continue processing using data having the prescribed correlation after confirming if there exists the prescribed correlation between the first and second data, or between the third and fourth data.

In a eighth aspect of the present invention, the first data, the second data, the third data, and the fourth data each are binary signals of m bits where m is an integer equal to or greater than 1; the third data is copy data copied from the first data, the second data is inverted data that inverts each bit of the first data, and the fourth data is inverted data that inverts each bit of the third data. With this arrangement, since the second and the fourth data are inverted data of the first and third data, if, for example, only one level of the binary signals appears on the communication line due to communication errors, the host circuit can surely detect the communication errors.

In a ninth aspect of the present invention, the integer m is an even number, and the data transmission section transmits, in synchronism with a clock signal, an upper m/2 bits of the first data, an upper m/2 bits of the second data, a lower m/2 bits of the first data, a lower m/2 bits of the second data, an upper m/2 bits of the third data, an upper m/2 bits of the fourth data, a lower m/2 bits of the third data, and a lower m/2 bits of the fourth data, in that order.

In a tenth aspect of the present invention, a data generation section that generates the second data, the third data, and the fourth data from the first data. With this arrangement, the second memory area may be omitted, whereby it is possible to reduce memory capacity.

In a eleventh aspect of the present invention, a first memory area for storing the first data, and a second memory area for storing the third data. With this arrangement, the host circuit can obtain the second data as correct data which is stored in the second memory area even if there are some memory defects in the first memory area.

In a twelfth aspect of the present invention, a data generation section that generates the third data from the first data, and generates the fourth data from the second data. With this arrangement, the host circuit can continue processing using data having the prescribed correlation after confirming if there exists the prescribed correlation between the first and second data, or between the third and fourth data.

In a thirteenth aspect of the present invention, the host circuit and the memory device are adapted to be electrically connected via circuit-side terminals that are electrically connected to the host circuit, and memory-device-side terminals that are electrically connected to the memory device and detachably attachable to the circuit-side terminals. With this arrangement, communication errors due to contact failure between the memory-device-side terminals and the circuit-side terminals can be detected, and the dependability of communication between the host circuit and the memory device is enhanced accordingly.

A fourteenth aspect of the present invention is directed to a host circuit electrically connectable to the memory device. The host circuit includes a data reception section that receives the first data and the second data from the memory device; and a determination section that determines whether the first data and the second data have the prescribed correlation. With this arrangement, the host circuit can determine if there exists a communication error between the host circuit and the memory device.

A fifteenth aspect of the present invention is directed to a host circuit electrically connectable to the memory device. The hose circuit includes a data reception section that receives the first data and the second data from the memory device; and a determination section that outputs an affirmative determination result if an exclusive OR outcome of an m-th value of the first data and an m-th value in the second data is true for all the n bits where m is an integer such that $1 \leq m \leq n$; and outputs a negative determination result if the exclusive OR outcome is false for any one of the n bits. With this arrangement, if, for example, only one level of the binary signals appears on the communication line due to communication errors, the host circuit can surely detect the communication errors.

A sixteenth aspect of the present invention is directed to a host circuit electrically connectable to the memory device. The host circuit includes a data reception section that receives the first data, the second data, the third data, and the fourth data from the memory device; and a first determination section that carries out a first determination to output an affirmative determination result if an exclusive OR outcome of a k-th value of the first data and a k-th value of the fourth data is true for all the m bits where k is an integer such that $1 \leq k \leq m$, or to output a negative determination result if the exclusive OR outcome is false for any one of the m bits. With this arrangement, the host circuit can determine if there exists a communication error between the host circuit and the memory device, or a memory defect in the data memory section.

In a seventeenth aspect of the present invention, the host circuit further includes a second determination section that carries out a second determination in instances where the determination result of the first determination is negative. The second determination section determines that an error has occurred in the nonvolatile data memory section of the memory device if an exclusive OR outcome of a k-th value of the first data and a k-th value of the second data is true for all the m bits, and also an exclusive OR outcome of a k-th value of the third data and a k-th value of the fourth data is true for all the m bits, and the second determination section determines that a communication error has occurred between the memory device and the host circuit if the exclusive OR outcome of the k-th value of the first data and the k-th value of the second data is false for any one of the m bits, or if the exclusive OR outcome of the k-th value of the third data and the k-th value of the fourth data is false for any one of the m bits. With this arrangement, the host circuit can properly detect a data memory section error and a communication error, respectively.

It is possible for the present invention to be embodied in various modes, for example, a circuit board detachably and electrically connectable to a liquid ejecting device; a liquid receptacle detachably installable in a liquid ejecting device; a method of transmitting data stored in a data memory section to a host circuit; a system that includes a host circuit and a memory device detachably installable to the host circuit; a liquid ejecting system; a computer program for accomplishing the functions of such methods or devices; or a recording medium having such a computer program recorded thereon.

DESCRIPTION OF THE PREFERRED EMBODIMENT

A. Embodiment

Configuration of Printing System

Figure 1:
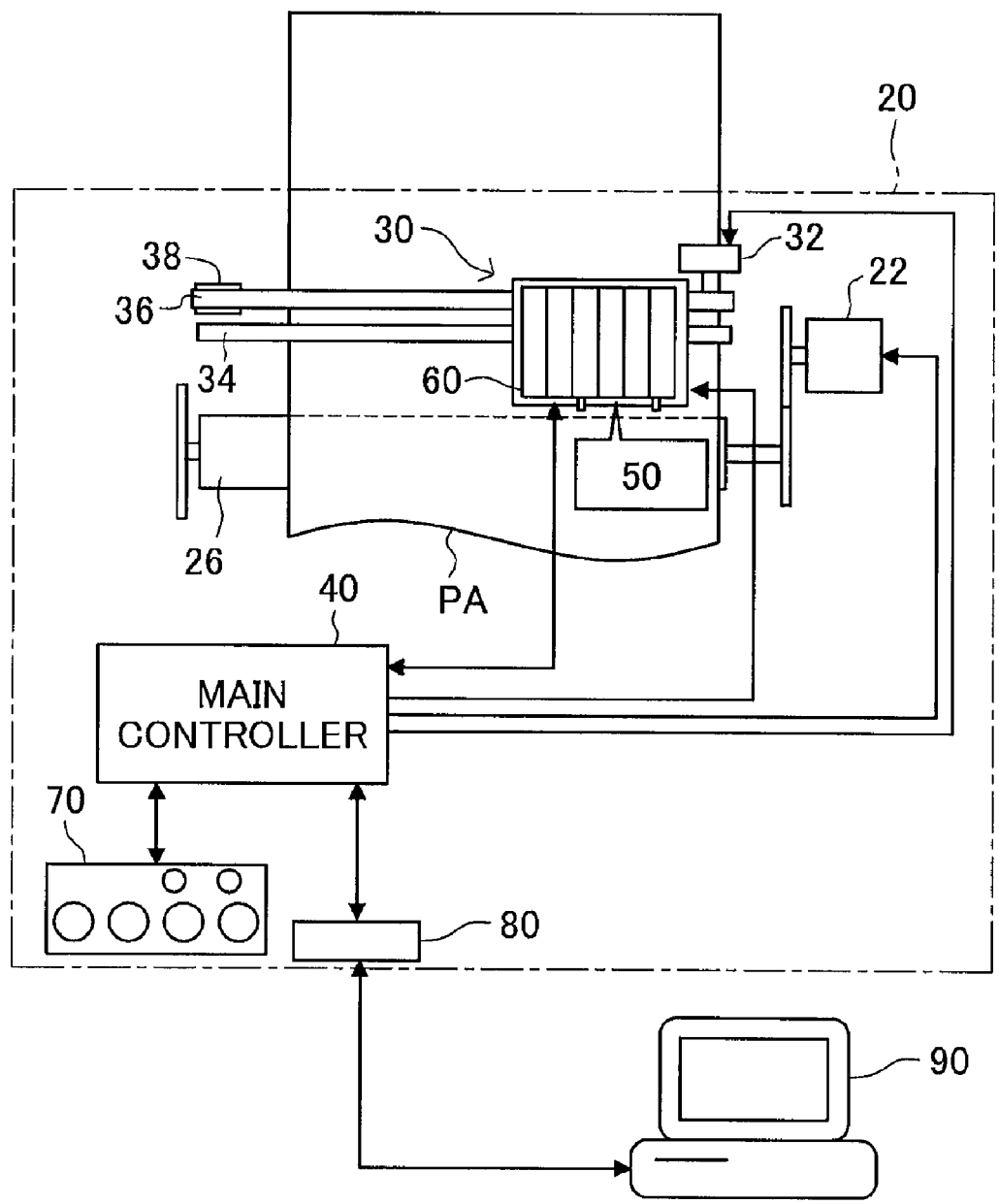
FIG. 1 illustrates a simplified configuration of a printing system.

FIG. 1 is an illustration depicting a simplified configuration of a printing system. The printing system includes a printer 20 provided as the printing device, and a computer 90. The printer 20 is connected to the computer 90 via a connector 80.

The printer 20 is furnished with a sub-scanning feed mechanism, a main scanning feed mechanism, a head driving mechanism, and a main controller 40. The sub-scanning feed mechanism has a paper feed motor 22 and a platen 26, and conveys paper PA in the sub-scanning direction by transmitting rotation of the paper feed motor to the platen. The main scanning feed mechanism includes a carriage motor 32, a pulley 38, a drive belt 36 stretched between the carriage motor and the pulley, and a slide rail 34 disposed parallel to the axis of the platen 26. The slide rail 34 slidably retains a carriage 30 that is affixed to the drive belt 36. Rotation of the carriage motor 32 is transmitted to the carriage 30 via the drive belt 36, whereupon the carriage 30 undergoes reciprocating movement in the axial direction of the platen 26 (the main scanning direction) along the slide rail 34. The head driving mechanism includes a print head unit 60 installed on the carriage 30, and is designed to drive a print head and eject ink onto the paper PA. The main controller 40 controls the above mechanisms and carries out printing operations. The main controller 40 for example receives a print job from a user via the computer 90, and control the above mechanisms to carry out printing based on the content of the received print job. As will be discussed later, a plurality of ink cartridges are detachably installable in the print head unit 60. Specifically, ink cartridges for supplying ink to the print head are disposed in the print head unit 60 in such a way as to be attachable and detachable through user operation. The printer 20 also has a console portion 70 allowing the use to perform various printer settings, check printer status, and so on.

Figure 2A:
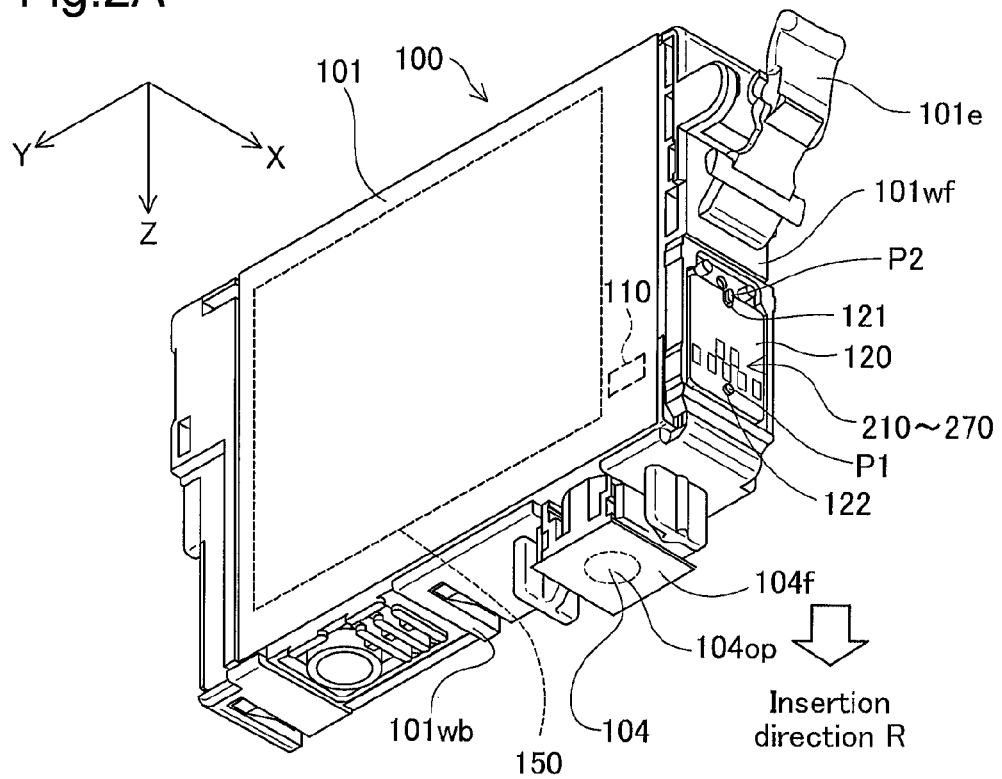
FIGS. 2A and 2B are perspective views depicting a configuration of an ink cartridge according to the embodiment.
Figure 2B:
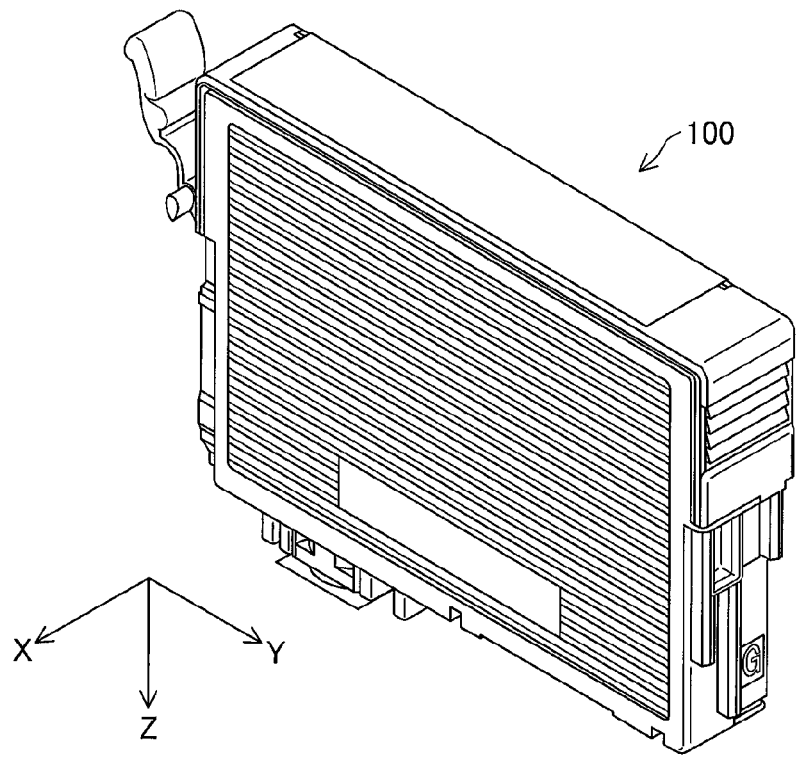
Figure 3A:
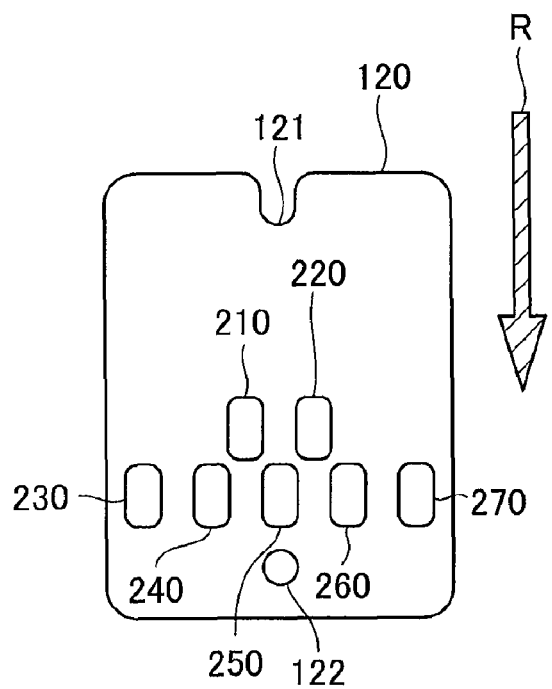
FIGS. 3A and 3B depict a configuration of a board according to the embodiment.
Figure 3B:
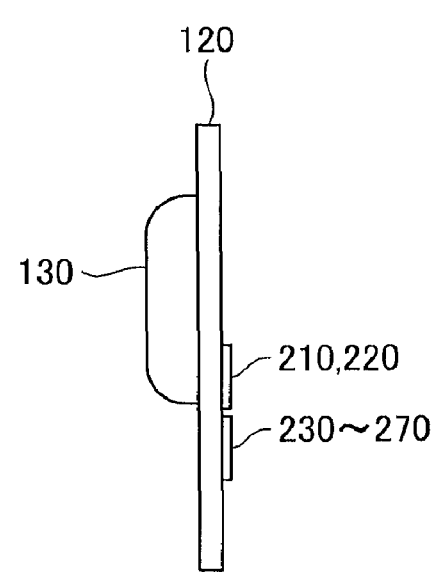
Figure 4:
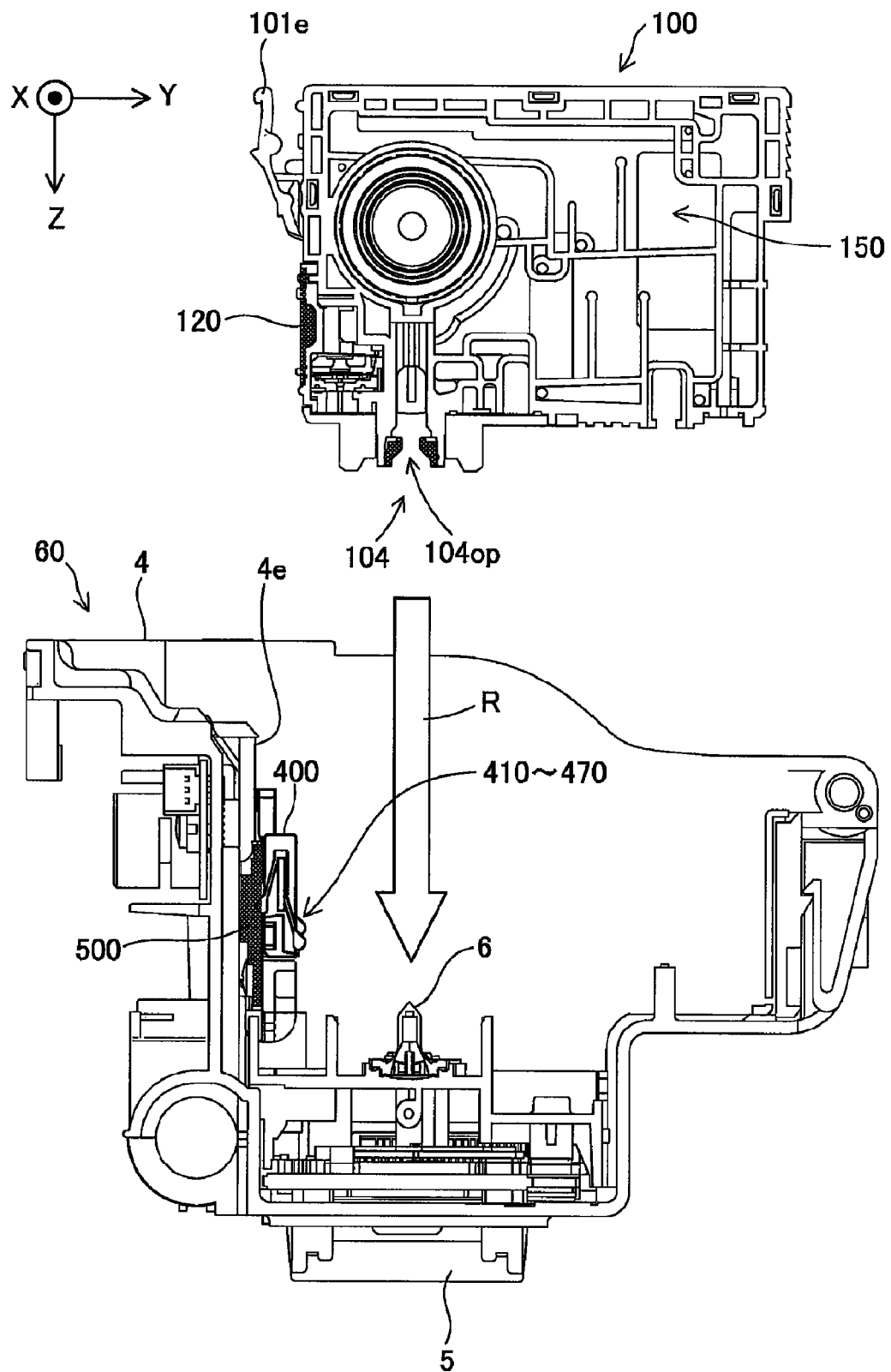
FIG. 4 illustrates a configuration of a print head unit.

The configuration of the printer, together with the configuration of an ink cartridge (liquid receptacle), will be discussed further with reference to FIGS. 2A, 2B, 3A, 3B, and 4. FIGS. 2A and 2B are perspective views depicting a configuration of an ink cartridge according to the embodiment. FIGS. 3A and 3B are drawings depicting a configuration of a printed circuit board (hereinafter termed simply a circuit board) according to the embodiment. FIG. 4 is a drawing illustrating a configuration of the print head unit 60.

The ink cartridge 100 has a main body 101 for containing the ink, a circuit board 120, and a sensor 110. On the base face of the main body 101 there is provided an ink delivery port 104 that, with the cartridge installed in the print head unit 60, delivers ink to the print head unit 60. An ink chamber 150 for containing the ink is formed in the main body 101. The ink delivery port 104 communicates with the ink chamber 150. The opening 104op of the ink delivery port 104 is sealed by a film 104f. By installing the ink cartridge 100 on the print head unit 60 (FIG. 4), the film 104f punctures and an ink delivery needle 6 inserts through the ink delivery port 104 (FIG. 4). The ink contained in the ink chamber 150 is delivered to the printer 20 through the ink delivery needle 6.

The sensor 110 is secured to the inside of the main body 101. As will be discussed later, the sensor 110 includes a piezoelectric element composed of a piezoelectric body sandwiched between two opposed electrodes, and is used for detecting the remaining ink level. The main body 101 includes a front wall 101wf (wall lying in the −Y direction) and a base wall 101wb (wall lying in the +Z direction). The front wall 101wf intersects (in the present embodiment, at a substantially right angle) the base wall 101wb. The circuit board 120 is secured to the front wall 101wf. The outside surface of the circuit board 120 is provided with terminals 210 to 270.

Two projections P1, P2 are formed on the front wall 101wf. These projections P1, P2 project out in the −Y direction. A hole 122 and a notch 121 adapted to respectively receive these projections P1, P2 are formed in the circuit board 120 (FIG. 3A). The hole 122 is formed in the center of the edge of the circuit board 120 on the ink delivery port 104 side (the +Z direction edge) thereof, while the notch 121 is formed in the center of the edge of the circuit board 120 on the opposite side from the ink delivery port 104 (the −Z direction edge). With the circuit board 120 mounted onto the front wall 101wf, the projections P1, P2 pass respectively through the hole 122 and the notch 121. During production of the ink cartridge 100, after the circuit board 120 is mounted on the front wall 101wf, the tips of these projections P1, P2 is collapsed. The circuit board 120 is secured thereby to the front wall 101wf.

Additionally, a mating projection 101e is provided in the front wall 101wf. The ink cartridge 100 is prevented from inadvertently detaching from the holder 4 through mating of the mating projection 101e and a mating aperture 4e of a holder 4 (FIG. 4).

The configuration of the print head unit 60, as well as installation of the ink cartridge 100 in the print head unit 60, is discussed with reference to FIG. 4. As depicted in FIG. 4, the print head unit 60 includes a holder 4, a connection mechanism 400, a print head 5, and a sub-control board 500. On the sub-control board 500 there are mounted a carriage circuit 50 and a group of terminals for respective connection via the connection mechanism 400 to the individual terminals 210 to 270 of the circuit board 120 of the ink cartridge 100. The holder 4 is designed to receive installation of several ink cartridges 100, and is situated on top of the print head 5. The connection mechanism 400 has electrically conductive connection terminals 410 to 470 provided for each of the terminals of the circuit board 120 and adapted to provide electrical connections between the terminals of the circuit board 120 of the ink cartridge 100, discussed later, and the terminals disposed on the sub-control board 500. The aforementioned ink delivery needles 6 for delivering ink from the ink cartridges 100 to the print head 5 are situated on the print head 5. The print head 5 includes several nozzles and several piezoelectric elements, and is adapted to eject droplets of ink from the nozzles in response to voltage applied to the piezoelectric elements, thereby producing dots on the paper PA. The carriage circuit 50 is a circuit designed to carry out control in relation to the ink cartridges 100 in concert with the main controller 40, and herein is also referred to as the sub-controller.

The ink cartridge 100 is installed in the holder 4 by inserting it in the Z-axis forward direction (the insertion direction R) in FIG. 4. The ink cartridge 100 is thereby detachably installed in the printer 20. The circuit board 120 which is mounted onto the ink cartridge 100 is installed in or uninstalled from the printer 20 in association with installation or uninstallation of the ink cartridge 100 by the user. When the ink cartridge 100 is installed in the printer 20, the circuit board 120 is electrically coupled with the printer 20.

The description of the circuit board 120 continues, returning to FIGS. 3A and 3B. The arrow R in FIG. 3A indicates the ink cartridge 100 insertion direction mentioned above. As shown in FIG. 3B, the circuit board 120 is provided with a memory device 130 on its back face, i.e. the face to the back side of the face that connects with the printer 20; and is provided with a terminal group composed of seven terminals on its front face, i.e. the face that connects with the printer 20. In the present embodiment, the memory device 130 is a semiconductor memory device that includes a ferroelectric memory cell array. This memory cell array, which corresponds to the data memory section of the present invention, stores data of various kinds relating to the ink cartridge 100 or to the ink, such as ink consumption, ink color, and so on. The ink consumption data indicates, for the ink contained in the ink cartridge in question, the cumulative total amount of ink consumed in the course of printing and in cleaning of the head. The data may represent the amount of ink per se, or represent the consumed ink as a percentage of a reference amount which is equivalent to the amount of ink initially contained in the ink cartridge.

The terminals on the front side of the circuit board 120 are formed with generally rectangular shape and placed so as to form two rows approximately orthogonal to the insertion direction R. Of these two rows, the row situated towards the insertion direction R (the distal edge side in the insertion direction when inserted), i.e. to the lower side in FIG. 3A, is termed the lower row; and the row situated to the opposite side from the insertion direction R, i.e. to the upper side in FIG. 3A, is termed the upper row. Here, the term "lower" is used for convenience for the purpose of description in terms of FIGS. 3A and 3B. The terminals which form the upper row and the terminals which form the lower row are configured in a so-called staggered arrangement through mutually different placement, so that the terminal centers are not lined up in the insertion direction R.

The terminals which are arrayed to form the upper row are, in order from the left in FIG. 3A, a ground terminal 210 and a power terminal 220. The terminals which are arrayed to form the lower row are, in order from the left in FIG. 3A, a first sensor drive terminal 230, a reset terminal 240, a clock terminal 250, a data terminal 260, and a second sensor drive terminal 270. The five terminals situated close to the center in the sideways direction, i.e. the ground terminal 210, the power terminal 220, the reset terminal 240, the clock terminal 250, and the data terminal 260, are respectively connected to the memory device 130 via circuit pattern layers (not shown) provided on the front and back faces of the circuit board 120, and through-holes situated in the circuit board 120. The two terminals situated at the ends of the lower row, i.e. the first sensor drive terminal 230 and the second sensor drive terminal 270, are respectively connected to one and the other of the electrodes of the piezoelectric element included in the sensor 110.

With this circuit board 120, the five terminals that are connected to the memory device 130 and the two terminals that are connected to the sensor 110 are situated in proximity to one another. Thus, in the connection mechanism 400 on the printer 20 side as well, the connection terminals 410, 420 and 440 to 460 that correspond to the five terminals connected to the memory device 130 and the connection terminals 430, 470 that correspond to the two terminals connected to the sensor 110 are likewise situated in proximity to one another.

With the ink cartridge 100 secured in the holder 4, the terminals of the circuit board 120 are electrically connected through contact with the connection terminals 410 to 470 of the connection mechanism 400. Additionally, the connection terminals 410 to 470 of the connection mechanism 400 are electrically connected through contact with the terminal group on the sub-control board 500; and the terminal group on the sub-control board 500 are in electrical connection with sub-controller (carriage circuit 50). Thus, when the ink cartridge 100 is secured in the holder 4, the terminals 210 to 270 of the circuit board 120 are in electrical connection with the sub-controller 50.

Figure 5:
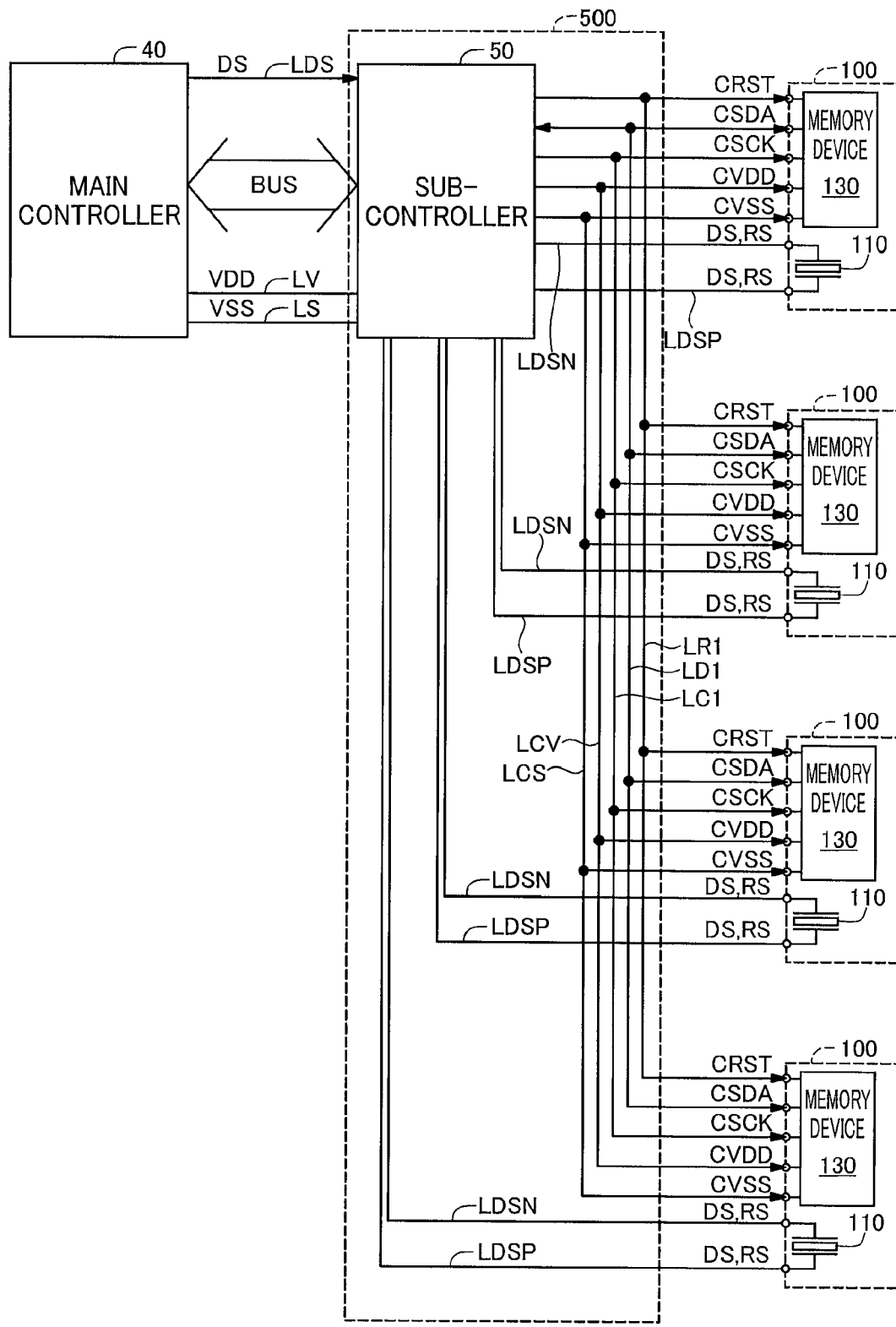
FIG. 5 is a first illustration depicting an electrical configuration of a printer.
Figure 6:
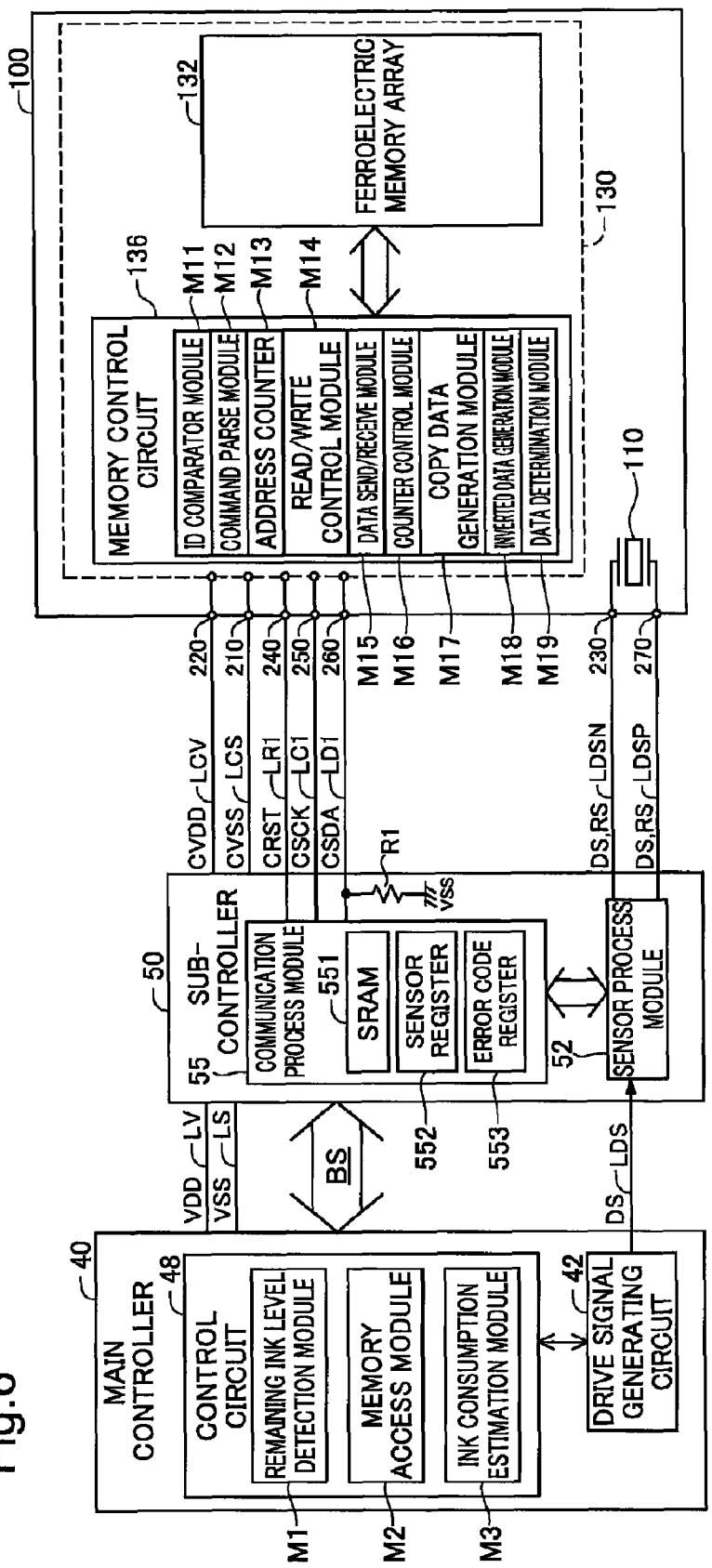
FIG. 6 is a second illustration depicting an electrical configuration of a printer.

Electrical Configuration of Printer:

FIGS. 5 and 6 are illustrations depicting the electrical configuration of the printer. The illustration in FIG. 5 is focused on the totality of the main control circuit 40, the sub-controller 50, and all of the ink cartridges 100 installable in the printer. FIG. 6 depicts the functional features of the main control circuit 40 and the functional features of the sub-controller 50, shown together with a single ink cartridge 100. The sub-controller 50 in the present embodiment corresponds to the host circuit of the present invention. In the present embodiment, the sub-controller 50 provided as the host circuit supplies power to the memory device 130 provided as the data memory section, and transmits commands indicating various types of access to the memory device 130 in order to write data to the memory device 130 or read data from the memory device 130 (discussed later).

The memory device 130 of each ink cartridge 100 is assigned an 8-bit ID number (identification information) different from all the others. Because as shown in FIG. 5 the memory devices 130 of the ink cartridges are parallel-connected to lines from the sub-controller 50 (i.e. they are bus-connected to the sub-controller 50), if an operation such as a read/write operation is to be carried out by the sub-controller 50 on the memory device 130 of a particular ink cartridge 100, it is necessary for the particular ink cartridge to be identified from the main controller 40 and the sub-controller 50. The ID number is used for this purpose. This ID number is used by the sub-controller 50 to specify a memory device 130 (ink cartridge 100) that is to be accessed.

The lines that electrically connect the sub-controller 50 with each ink cartridge 100 include the lines connecting the sub-controller 50 with the terminal group of the sub-control board 500; the connection terminals 410 to 470 of the connection mechanism 400; the terminal group on the front side of the circuit board 120; and the lines leading from the terminal group of the circuit board 120 to the memory device 130 and to the sensor 110. The lines that electrically connect the sub-controller 50 with each ink cartridge 100 include a reset signal line LR1, a clock signal line LC1, a data signal line LD1, a first ground line LCS, a first power line LCV, a first sensor drive signal line LDSN, and a second sensor drive signal line LDSP.

The reset signal line LR1 between the sub-controller 50 and the memory device 130 is a conductive line for sending a reset signal CRST from the sub-controller 50 to the memory device 130. The reset signal is a signal by which the sub-controller 50 may place the memory control circuit 136 (discussed later) of a memory device 130 in the initialized state, or in a standby state in which it can accept access. When a low level reset signal is presented to a memory control circuit 136 by the sub-controller 50, the memory control circuit 136 goes into the initialized state. The clock signal line LC1 between the sub-controller 50 and the memory device 130 is a conductive line for sending a clock signal CSCK from the sub-controller 50 to the memory device 130. The data signal line LD1 between the sub-controller 50 and the memory device 130 is a conductive line for sending data signals CSDA that are exchanged between the sub-controller 50 to the memory device 130. As shown in FIG. 6, in the sub-controller 50, the data signal line LD1 is connected to ground potential CVSS (0 V) via a pull-down resistor R1. As a result, potential on the data signal line LD1 is held at low level, particularly when data signals are not being exchanged between the sub-controller 50 and the memory device 130. In order to achieve synchronization between the sub-controller 50 and the memory device 130, data signals are transmitted and received in sync with the clock signal mentioned above. For example, the exchange may take place such that signals are transmitted or received while a rise or fall of the clock signal is used as a valid data timing. Each of these three lines LR1, LC1, LD1 is a line having a single terminus at the sub-controller 50, and branched termini, corresponding in number to the number of ink cartridges 100, at the ink cartridge 100. That is, with respect to the three lines LR1, LC1, LD1, the plurality of memory devices 130 are bus-connected to the sub-controller 50. The reset signal CRST, the data signal CSDA, and the clock signal CSCK are all binary signals that have either high level (in the present embodiment, CVDD potential of 3.3 V) or low level (in the present embodiment, CVSS potential of 0 V). Herein, a high level signal is also represented by the value "1", and a low level signal is also represented by the value "0".

The first ground line LCS is a conductive line for providing ground potential CVSS to the memory device 130, and is electrically connected to the memory device 130 via the ground terminal 210 of the circuit board 120. The first ground line LCS is a line having a single terminus at the sub-controller 50, and branched termini, corresponding in number to the number of ink cartridges 100, at the ink cartridge 100. The ground potential CVSS is connected to ground potential VSS (=CVSS potential) supplied to the sub-controller 50 by the main controller 40 via a second ground line LS, and is set to low level (0 V).

The first sensor drive signal line LDSN and the second sensor drive signal line LDSP are conductive lines adapted to apply a driving voltage to the piezoelectric element of the sensor 110, and after ceasing to apply the driving voltage, transmitting to the sub-controller 50 a voltage produced by the piezoelectric effect of the piezoelectric element. The first sensor drive signal line LDSN and the second sensor drive signal line LDSP are a plurality of lines that respectively are provided independently for each ink cartridge 100, and each of which is electrically connected at a first end to the sub-controller 50 as well as electrically connected at the other end to the first sensor drive terminal 230 and the second sensor drive terminal 270 of the circuit board 120, respectively. The first sensor drive signal line LDSN is electrically connected via the first sensor drive terminal 230 to one of the electrodes of the piezoelectric element of the sensor 110, while the second sensor drive signal line LDSP is electrically connected via the second sensor drive terminal 270 to the other electrode of the piezoelectric element of the sensor 110.

The first power line LCV is a conductive line for providing the power supply voltage CVDD, which represents the operating voltage of the memory device 130, to the memory device 130; and is connected to the memory device 130 via the power supply terminal 220 of the circuit board 120. The first power line LCV is a line having a single terminus at the sub-controller 50, and branched termini, corresponding in number to the number of ink cartridges 100, at the ink cartridge 100. The high level power supply voltage CVDD used to drive the memory device 130 uses potential of about 3.3 V versus the low level ground potential CVSS (0 V). Of course, depending on factors such as the generation of processor of the memory device 130, the potential level of the power supply voltage CVDD may be a different potential, such as 1.5 or 2.0 V for example.

The main controller 40 and the sub-controller 50 are electrically connected by several lines. These several lines include a bus BS, a second power supply line LV, a second ground line LS, and a third sensor drive signal line LDS. The bus BS is used for data communications between the main controller 40 and the sub-controller 50. The second power supply line LV and the second ground line LS are conductive lines for providing the main controller 40 and the sub-controller 50 with power supply voltage VDD and ground potential VSS respectively. The power supply voltage VDD uses potential of the same level as the power supply voltage CVDD provided to the memory device 130 mentioned previously, for example, of about 3.3 V versus the ground potential VSS and CVSS (0 V). Of course, depending on factors such as the generation of processor of the logic IC section of the sub-controller 50, the potential level of the power supply voltage VDD may be a different potential, such as 1.5 or 2.0 V for example. The third sensor drive signal line LDS is a conductive line for providing a sensor drive signal DS (described later) which is ultimately applied to each sensor 110, from the main controller 40 to the sub-controller 50.

The main controller 40 is provided with a control circuit 48, a drive signal generating circuit 42, and ROM, RAM, EEPROM or the like (not shown). Various programs for controlling the printer 20 are stored in the ROM.

The control circuit 48 is a CPU (central processing unit), and performs control of the printer 20 as a whole in concert with the ROM, RAM, EEPROM or other memory. The control circuit 48 is provided with the function blocks of a remaining ink level detection module M1, a memory access module M2, and a ink consumption estimation module M3.

The remaining ink level detection module M1 controls the sub-controller 50 and the drive signal generating circuit 42, drives the sensor 110 of the ink cartridge 100, and decides whether the ink in the ink cartridge 100 equals a prescribed value or greater. Through the sub-controller 50, the memory access module M2 accesses the memory device 130 of the ink cartridge 100 and either reads out the information stored in the memory device 130, or updates the information stored in the memory device 130. The ink consumption estimation module M3 is designed to count the dots that are jetted onto the printer paper in association with conditions of printing operations of the printer 20; and from this count value and the amount of ink consumed by each dot, estimates the amount of ink consumed by printing operations. The amount of ink consumed in head cleaning operations is estimated as well. On the basis of these estimates, a count is kept of the cumulative estimated value for ink consumption consumed from the ink cartridge since the ink cartridge 100 was first installed in the printer 20.

The EEPROM of the main controller 40 stores data representing a sensor drive signal DS for driving the sensor. In accordance with an instruction from the remaining ink level detection module M1 of the control circuit 48, the drive signal generating circuit 42 reads out from the EEPROM data that represents a waveform for the sensor drive signal DS, and generates a sensor drive signal DS having the desired waveform. The sensor drive signal DS includes a potential that is greater than the power supply voltage CVDD (in the present embodiment, 3.3 V); in the present embodiment for example, it includes a maximum potential of about 36 V. Specifically, the sensor drive signal DS is a trapezoidal pulse signal having maximum voltage of 36 V.

In the present embodiment, the drive signal generating circuit 42 can additionally generate a head drive signal for presentation to the print head 5. Specifically, in the present embodiment, during determination of the remaining ink amount, the control circuit 48 prompts the drive signal generating circuit 42 to generate a sensor drive signal, and during printing operations it prompts the drive signal generating circuit 42 to generate a head drive signal.

In terms of hardware configuration, the sub-controller 50 is provided with an ASIC (Application Specific IC). The ASIC has a communication process module 55 and a sensor process module 52 by way of functional features.

The communication process module 55 carries out communication processes with the memory device 130 of each of the ink cartridges 100 via the reset signal line LR1, the data signal line LD1, and the clock signal line LC1. The communication process module 55 also carries out communication processes with main controller 40 through the agency of the bus BS. By detecting the potentials on prescribed terminals of the terminal group of the circuit board 120, the communication process module 55 is able to detect whether the circuit board 120 of an ink cartridge 100 is electrically connected to the printer 20, that is, whether the ink cartridge 100 is installed in the printer 20. The communication process module 55 then notifies the main controller 40 that it has detected the installed ink cartridges 100. Through this process the main controller 40 is able to determine whether the ink cartridges 100 are mounted in the cartridge mounting section.

If the main controller 40 determines that the circuit boards 120 are electrically connected and that the ink cartridges 100 are installed in the printer 20, it then accesses the memory devices 130 of the installed ink cartridges 100 at prescribed timing, via the communication process module 55.

The communication process module 55 is a circuit that includes a logic circuit composed of an ASIC or the like, and that is driven by the power supply voltage VDD (in the present embodiment, 3.3 V). In the present embodiment the ASIC is composed of a memory cell area block (SRAM 551) and a logic area, with the logic area being provided with a sensor register 552 and an error code register 553. The SRAM 551 is a memory used to temporarily save data during operations of the communication process module 55, i.e. to temporarily save data received from the main controller 40, or data received from the sensors 110 or the memory devices 130, for example. After the printer 20 is powered on, in the SRAM 551 there is allocated memory space sufficient to store data corresponding to the original data and corresponding to inverted mirror data of the original data in the memory device 130 of each ink cartridge 100 (discussed later); and the data that is read out from the memory devices is then stored in this allocated memory space. Specifically, in the memory space in the SRAM 551 there is allocated a memory area sufficient to store the 16-bit original data and the inverted mirror data of the 16-bit original data, in the same number of rows as the memory cell array of each memory device 130. Then, the original data which is read out from the memory array of each memory device, together with the inverted mirror data thereof, is stored in the allocated memory area. The values which are read out to the memory area are subsequently updated in association with printing operations (in association with transmission of write data from the main controller 40 and reading of data from the memory devices). Communication errors and memory cell errors, discussed later, occurring in relation to rows in the rewritable memory area of each memory device 130 are written into the error code register 553.

The sensor register 552 is a register used by the sensor process module 52 to write process outcomes of sensor processes. A sensor process module 552 is provided for each ink cartridge, and is used to record results of determination of remaining ink level, discussed later.

The sensor process module 52 executes a remaining ink level determination process using the sensor (sensor process), discussed later. The sensor process module 52 includes a changeover switch. The changeover switch is used to present a sensor drive signal DS supplied by the drive signal generating circuit 42, to the sensor 110 of a single ink cartridge 100 that is targeted for the sensor process, doing so via either the first sensor drive signal line LDSN or the second sensor drive signal line LDSP.

Next, the electrical configuration of the ink cartridges 100 is described. Each ink cartridge 100 has as its electrical elements a memory device 130 and a sensor 110.

The memory device 130 is not designed to accept external input of address data that specifies the address of an access location. The memory device 130 does not accept direct input of address data; however, it is controllable in order to specify memory cells to be accessed, in response to an externally supplied clock signal and command data. The memory device 130 includes a ferroelectric memory cell array 132 provided as the data memory section; and a memory control circuit 136. As indicated by white circles on the broken lines that represent the memory device 130 in FIG. 6, the memory device 130 is provided with a ground terminal for electrical connection to the ground terminal 210 of the circuit board 120, a power terminal for electrical connection to the power terminal 220, a reset terminal for electrical connection to the reset terminal 240, and a clock terminal for electrical connection to the clock terminal 250.

The ferroelectric memory cell array 132 is a nonvolatile semiconductor memory cell array that uses ferroelectric memory elements, and provides a memory area having a data-rewritable feature.

The memory control circuit 136 is designed to control read and write operations to the ferroelectric memory cell array 132 in response to the command data from the sub-controller 50. The memory control circuit 136 analyses identification data and command data sent from the sub-controller 50. Also, during a write operation, on the basis of write content data received from the sub-controller 50 the memory control circuit 136 generates write data and write it to the ferroelectric memory cell array 132. Or, during a read operation, on the basis of read data from the ferroelectric memory cell array 132 the memory control circuit 136 generates data for transmission to the sub-controller 50. This will be discussed in detail later.

The memory control circuit 136 is furnished with an ID comparator module M11, a command parse module M12, an address counter M13, a read/write control module M14, a data send/receive module M15, a counter control module M16, a copy data generation module M17, an inverted data generation module M18, and a data determination module M19. The ID comparator module M11 is designed to compare ID data that is supplied from the sub-controller 50, and the ID number that is assigned to its own memory device; and to then decide whether the target of access is the memory device itself. The ID number of the memory device is stored in the memory cells that are connected to the word line which is selected on the basis of the output of the address counter M13 when access from the sub-controller 50 is initiated subsequent to initialization of the memory device 130. This ID number is used to distinguish a memory device 130 targeted for access by the sub-controller 50, from among the several memory devices 130 which are bus-connected to the sub-controller 50. This ID number may be chosen according to the color of the ink contained in the ink cartridge 100, for example. The command parse module M12 is designed to parse Start of Frame data (SOF), End of Frame (EOF) data, and command data sent from the sub-controller 50, and to decide the start of access and end of access from the sub-controller 50, as well as the type of access (read, write, etc.). When a low level reset signal CRST is input to the memory device 130 so that the memory device 130 is initialized, the address counter M13 resets the counter value. During reset the counter value is set to a value that selects the word line including the memory cells in which the ID number is stored. Subsequently, on the basis of control from the counter control module M16, a prescribed number of clock pulses are sequentially counted from among the clock pulses input to the memory device 130. When a memory cell is accessed through control by the read/write control module M14, the counter value of the address counter M13 is output from the address counter M13 to an address decoder of the memory cell array, not shown. Consequently, a prescribed row (word line) of the memory cell array 132 is selected in correspondence with the counter value. In the present embodiment, a "row" is selected by the address decoder on the basis of the counter value output by address counter M13. According to the content of the command data (indicative of the type of access) that was parsed by the command parse module M12, the read/write control module M14 performs a batch write operation into a single row and a batch read operation from a single row of the ferroelectric memory array 132 that is connected to the word line selected by the address counter M13. The read/write control module M14 is provided with a register, not shown, and is able to temporarily store original data, inverted data, and mirror data, discussed later in detail. The data send/receive module M15 synchronously with the clock signal CSCK receives a data signal CSDA sent from the sub-controller 50 via the data signal line LD1, or synchronously with the clock signal CSCK sends a data signal CSDA via the data signal line LD1. Specifically, the data send/receive module M15 sets the send/receive direction of data signals CSDA exchanged between the memory device 130 and the sub-controller 50. After initialization, when access to the memory device 130 by the sub-controller 50 is initiated, the send/receive direction of the data send/receive module M15 is set to the direction in which the memory device 130 receives data signals CSDA sent from the sub-controller 50, so that data read out from the memory cell array 132 is not sent from the memory device 130 to the sub-controller 50. The copy data generation module M17 is adapted to copy original data (discussed later) to generate mirror data (discussed later) equal in size to the original data. The inverted data generation module M18 is adapted to invert the value of each bit of the original data to generate inverted data (discussed later) equal in size to the original data. The data determination module M19 is designed to perform a parity check and exclusive OR operation of the original data and the mirror data, discussed later, to determine the consistency of the data. The counter control module M16 is furnished with a clock counter. After access to the memory device 130 by the sub-controller 50 is initiated after the memory device 130 is initialized, the counter control module M16 counts the number of clock pulses of the clock signal CSCK input to the memory device 130. After a prescribed counter value is reached, based on the outcome of command parsing by the command parse module M12, the counter control module M16 issues a control signal to the address counter M13 to cause the address counter M13 to either count up or count down the counter value. The data send/receive module M15 in the present embodiment corresponds to the data reception section and the data transmission section in the present invention.

Figure 7:
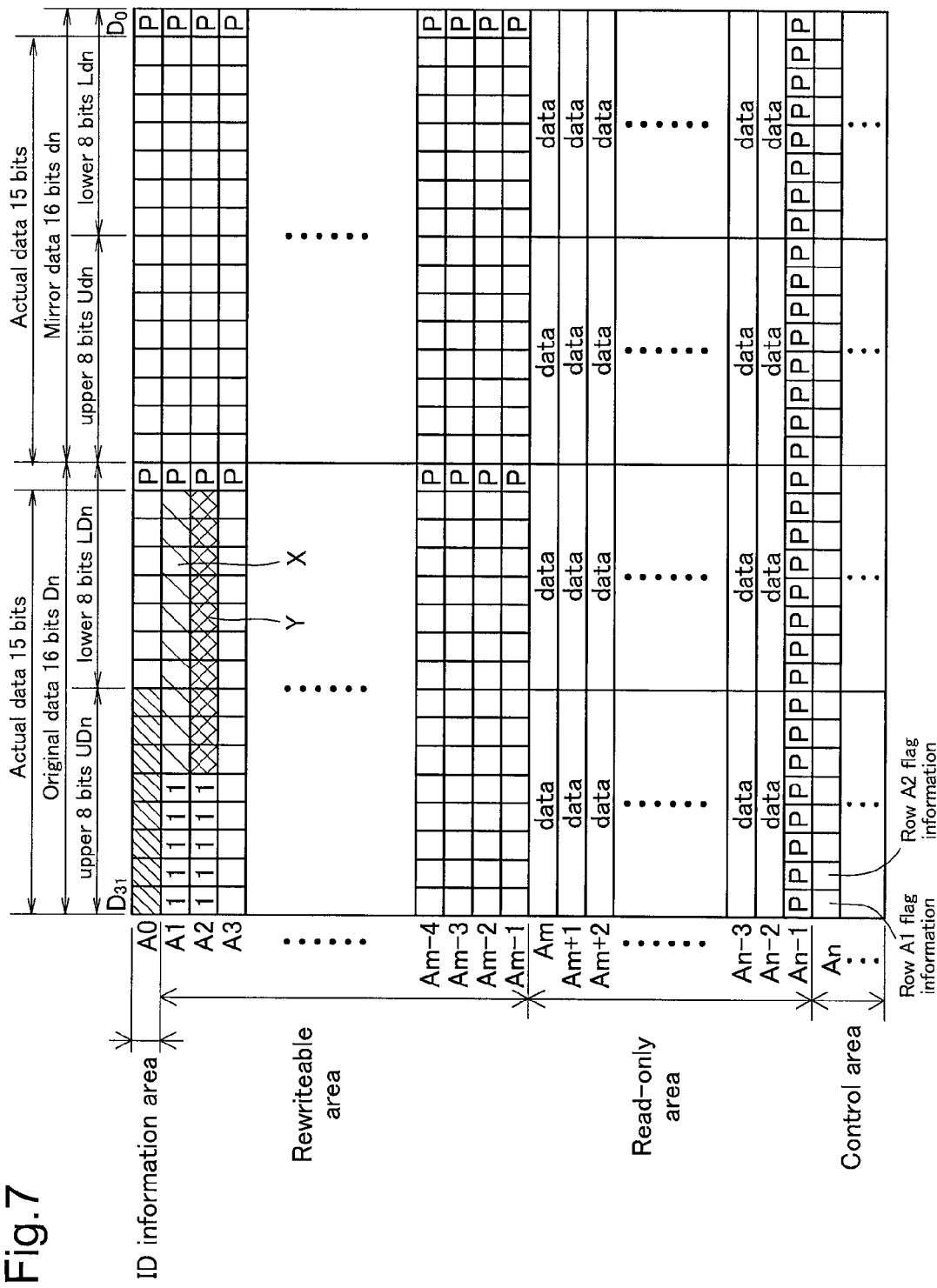
FIG. 7 schematically depicts a memory map of memory areas provided by a ferroelectric memory array of a memory device.

FIG. 7 is a drawing schematically depicting a memory map of the ferroelectric memory array 132 of the memory device 130. In FIG. 7, the memory map of the ferroelectric memory array 132 is composed of multiple rows, each row having 32 cells. The memory cell array 132 is accessed sequentially, in order of row selected by the value indicated by the address counter. In the memory map depicted in FIG. 7, the order of sequential access is from the top to the bottom side, in row units. Here, for convenience, in any given row, memory cells further towards the left side (the D31 side) are termed higher order cells. For different rows, a higher order row than a particular row means a row to the upper side (a row having a smaller row number) than the particular row in FIG. 7; and a lower order row than a particular row means a row to the lower side (a row having a larger row number) than the particular row in FIG. 7. As shown in the memory map, the memory cell array 132 has an identification information area, a rewriteable area, a read-only area, and a control area. The identification information area has the 32-bit memory area of Row A0, and is used to store the ID number mentioned earlier. The rewriteable area has a memory area of (m−1) rows, where m is a natural number, from Row A1 to Row Am−1 in FIG. 7. The rewriteable area is an area accessed for the purpose of rewriting data by the sub-controller 50 of the printer 20. The read-only area has a memory area of (n−m) rows from Rows Am to An−1. The read-only area is accessed for the exclusive purpose of reading data by the sub-controller 50 of the printer 20. The control area is provided as a lower order area from the read-only area. The control area is a memory area for storing increment flag information and write lock flag information, discussed later. Each single row of the storage areas of the memory map of the memory cell array 132 has 32 bit storage capacity. A single row corresponds to a row selected by the address counter M13 (i.e. a word line). Within a single row, the upper 16 bits represent a data area for storing original data. Here, original data refers to data that is the source for inverted data and mirror data, discussed later. Herein, the data area for storing the original data is termed the original data area. Within a single row, the lower 16 bits represent a data area for storing mirror data which is a copy of the original data that is stored on the upper 16 bits. Herein, the data area for storing the mirror data is termed the mirror data area. In FIG. 7, the left half represents the original data area, and the right half represents the mirror data area. Stated the opposite way, in FIG. 7, the data that is stored in the original data area in the left half is original data, and the data that is stored in the mirror data area in the right half is mirror data. Under normal circumstances, i.e. in the absence of any write errors or faulty cells in a given row, the original data and the mirror data in each row have identical content.

In the identification information area and the rewriteable area, the upper 15 bits of the original data area of each row are used for storing actual data; while the last bit (the 16th bit) is used for storing parity data P that is associated with the actual data. In the present embodiment, actual data is data that is used by the main controller 40 of the printer 20 for controlling various aspects of printer 20 operation (e.g. printing operations, control of the user interface). In the present embodiment, the actual data includes, for example, data representing remaining ink level, the date and time that the ink cartridge was first placed in service, and so on. The upper 15 bits of the mirror data area are used for storing mirror data of the actual data of the original data, while the last bit (the 16th bit) is used for storing mirror data of the parity data P that is associated with the actual data of the original data. The parity data P is a redundant bit that is set to a value of either "1" or "0" in such a way that the number of bits of "1" value in 16-bit data consisting of the upper 15 bits and the parity data P is always an odd number. The parity data P may instead be set to either "1" or "0" in such a way that the number of bits of "1" value in 16-bit data consisting of the upper 15 bits and the parity data P is always an even number. The parity data P should not be construed as limiting, and any of various of types of redundancy data that provide redundancy of actual data may be used instead.

Of the (n–m) rows in the read-only area, rows except for the last row An−1 are used for actual data storage, while the last row is used for parity data storage. Specifically, for each of prescribed units of actual data (e.g. 8-bit or 16-bit units) of rows except for the last row, 1-bit parity data is assigned to a bit in the last row. In FIG. 7, the cells denoted by "P" represent 1-bit memory areas for storing parity data P.

As will be appreciated from the preceding discussion, in the identification information area and the rewriteable area, the original data consists of actual data and parity data. In the read-only area, in areas apart from the last row, the original data is actual data per se. In the read-only area, in the last row, the original data is parity data.

The rewriteable area stores various kinds of information, for example, remaining ink level information or usage history information for the ink cartridge 100. The ID number (identification information, which is chosen for each type (color) of ink cartridge 100, is stored on the 8 bits starting from the lead cell in the leading first row (the identification information area of Row A0) which is selected by the initial value of the address counter M13 immediately after access to the memory device 130 is initiated. In FIG. 7, the area storing the ID number is indicated by fine hatching. The remaining cells of Row A0, i.e. excepting the original data parity bit cells and the cells storing the ID number, constitute empty areas and store fixed data of 0 or 1. For example, where the number of ink cartridges 100 installed in the printer 20 is n, the ID number may assume n types of values that differ according to the type of ink cartridge 100. The first row of the rewriteable area (Row A1) stores a first ink consumption count value X (e.g. on 10 bits), and the second row (Row A2) stores a second ink consumption count value Y (e.g. on 10 bits). The first ink consumption count value X represents 10-bit information for example, and is stored in the cells of the lower 10 bits among 15 bits excepting the parity information cell of Row A1. The remaining 5 bits of Row A1 constitute an empty area storing fixed data, and data is sent from the printer 20 so that "1"s are always stored therein. In FIG. 7, the area storing the first ink consumption count value X is indicated by coarse hatching. The second ink consumption count value Y represents 10-bit information for example, and is stored in the cells of the lower 10 bits among 15 bits excepting the parity information cell of Row A2. The remaining 5 bits of Row A2 constitute an empty area, and data is sent from the printer 20 so that "1"s are always stored therein. In FIG. 7, the area storing the second ink consumption count value Y is indicated by crosshatching. The first ink consumption count value X and the second ink consumption count value Y are values that represent cumulative total ink consumption for each ink cartridge 100, derived on the basis of the ink consumption that was estimated by the ink consumption estimation module M3 in the printer 20. Ink end information M is also stored in a prescribed row of the rewritable area. The ink end information M may be 2-bit data that assumes one of three states "01", "11" or "01" for example. "01" represents a state in which the sensor 110 of the ink cartridge 100 has not detected that the remaining ink level is equal to or less than a first threshold value Vref1 (hereinafter also referred to as the full state), that is, that the remaining ink level is greater than the first threshold value Vref1. "10" represents a remaining ink level equal to or less than the first threshold value Vref1 and greater than the ink end level (hereinafter also referred to as the low state; that is, first threshold value Vref1>ink end level. The fact that the remaining ink level is equal to or less than the first threshold value Vref1 is detected by the sensor 110 of the ink cartridge 100 in question. "11" represents a remaining ink level at or below the ink end level (hereinafter also referred to as the end state). The ink end level is a level of remaining ink at which, if the printer 20 continues to print uninterrupted, poses a risk of air becoming incorporated into the print head unit 60 due to ink depletion, thus making it imperative to replace the ink cartridge 100. For example, the first threshold value Vref1 may be set to about 1.5 grams, and the ink end level may be set to a remaining ink level of about 0.8 grams. Processes relating to the first ink consumption count value X, the second ink consumption count value Y, and the ink end information M will be discussed later.

The read-only area stores, for example, manufacturer information indicating the manufacturer of the ink cartridge 100, the date of manufacture of the ink cartridge, the ink cartridge 100 capacity, the type of ink cartridge, and so on. The control area stores increment flag information and write lock information.

One bit of increment flag information is provided for each row on the memory map. A row whose associated increment flag information is set to "1" represents an area in which the row is allowed to be overwritten with only a larger numerical value than the numerical value already stored in the row (incremental overwrite), but the row is not allowed to be overwritten with a smaller numerical value than the numerical value already stored in the row (decremental overwrite). A row whose associated increment flag information is set to "0" is allowed to be overwritten freely. The decision as to whether to allow only incremental overwrites or to allow free overwriting is made by the read/write control module M14 of the memory control circuit 136, with reference to the increment flag information. Specifically, for Row A1 and Row A2 which record the aforementioned first ink consumption count value X and second ink consumption count value Y, the corresponding increment flag information is set to "1". The reason is that it is difficult to imagine that updating of first ink consumption count value X and the second ink consumption count value Y by the printer 20 would take place in anything other than the increasing direction. This can reduce the likelihood of write errors to Row A1 and Row A2. Hereinbelow, memory areas for which, like Row A1 and Row A2, the corresponding increment flag information is set to "1" is also referred to as increment areas. Overwriting to a row may be allowed in instances where the data overwrite is an incremental overwrite made in 16-bit original data units rather than in row units. Where remaining ink level, rather than ink consumption, is saved in a row of the memory, this row may be controlled by a flag value that indicates whether to allow only decremental overwriting or to allow free overwriting.

One bit of write lock flag information is provided for each row in the identification information area, the rewriteable area, and the read-only area. A row whose associated write lock flag information is set to "1" represents an area that is not allowed to be overwritten through external access. A row whose associated write lock flag information is set to "0" represents an area that is allowed to be overwritten through external access. The decision as to whether to allow overwriting is made by the read/write control module M14 of the memory control circuit 136, with reference to the write lock flag information. For the rewriteable area, i.e. Rows A1 to Am−1, the corresponding write lock flag information is set to "0" at the factory prior to shipping, so as to permit erasing and/or rewriting of data by the communication process module 55 of the printer 20. On the other hand, for the identification information area, i.e. Row A0, and for the read-only area, i.e. Rows Am to An−1, the corresponding write lock flag information is set to "1" at the factory prior to shipping, so as to prohibit erasing and/or rewriting of data by the communication process module 55 of the printer 20. Such memory areas for which the write lock flag information is set to "1" is also referred to as write-locked areas.

The sensor 110, which is not depicted in detail in the drawings, is furnished with a cavity (resonance portion) that defines part of the ink flow channel in proximity to the ink delivery section; an oscillator plate forming part of the wall of the cavity; and a piezoelectric element arranged on the oscillator plate. The sensor process module 52 of the printer 20 can apply a sensor drive signal DS to the piezoelectric element via the sensor drive terminals 230, 270, and thereby induce oscillation of the oscillator plate through the agency of the piezoelectric element. Then, by receiving from the piezoelectric element a response signal RS having the frequency of the residual vibration of the oscillator plate, the sensor process module 52 can detect if ink is present or absent in the cavity. Specifically, if the ink contained in the main body 101 is consumed so that the condition of the cavity interior changes from a condition filled with ink to a condition filled with air, the frequency of the residual vibration of the oscillator plate changes. This change in frequency is reflected in a change in frequency of the response signal RS. By measuring the frequency of the response signal RS, the sensor process module 52 can detect if ink is present or absent in the cavity. Detecting that ink is "absent" in the cavity means that the remaining ink level contained in the main body 101 is equal to or less than the first threshold value Vref1 (this corresponds to the amount of ink remaining downstream from the cavity). Detecting that ink is "present" in the cavity means that the remaining ink level contained in the main body 101 is greater than the first threshold value Vref1.

Figure 8:
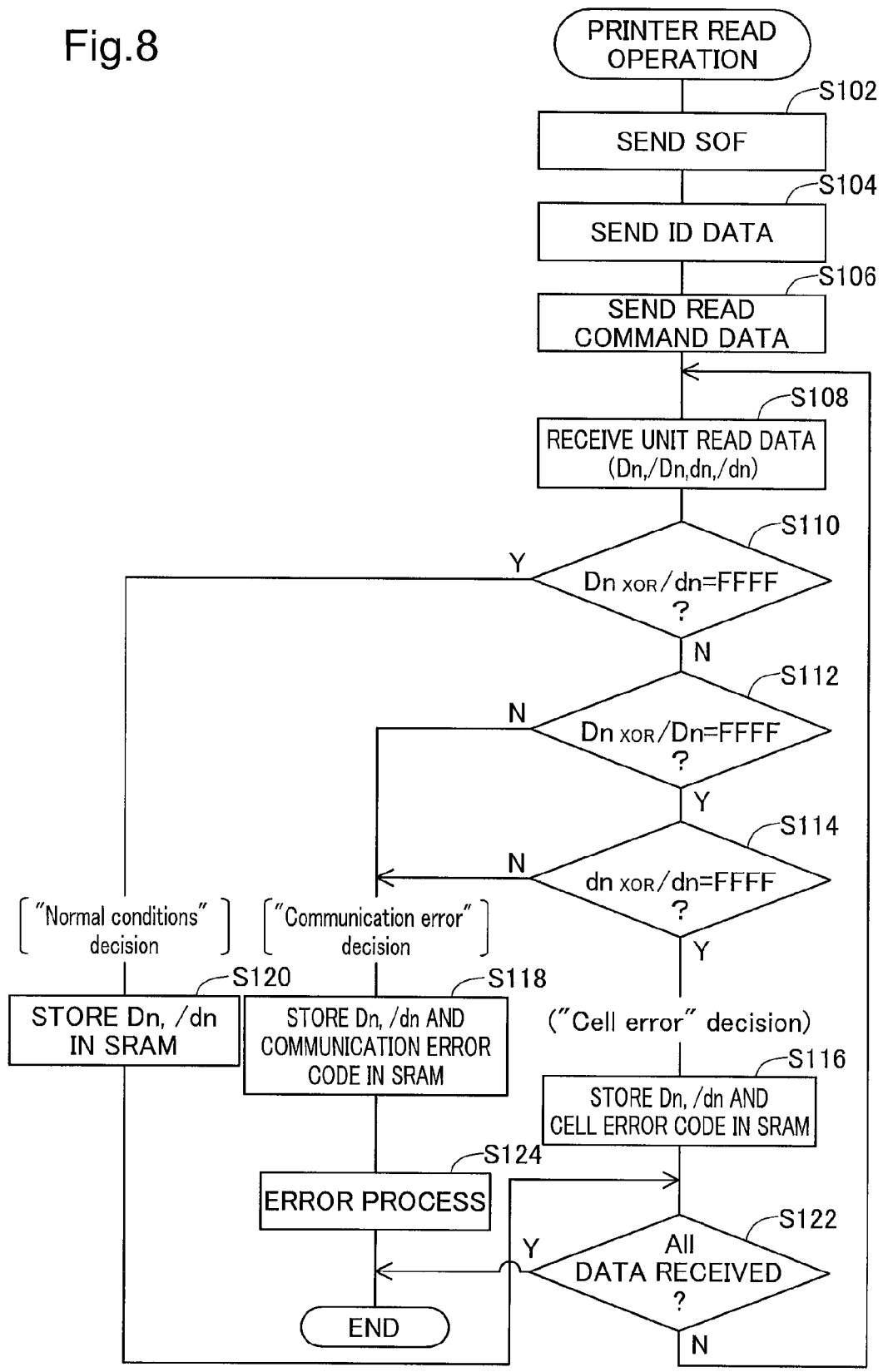
FIG. 8 is a flowchart depicting a processing routine of a read operation from a memory device on the printer.
Figure 9:
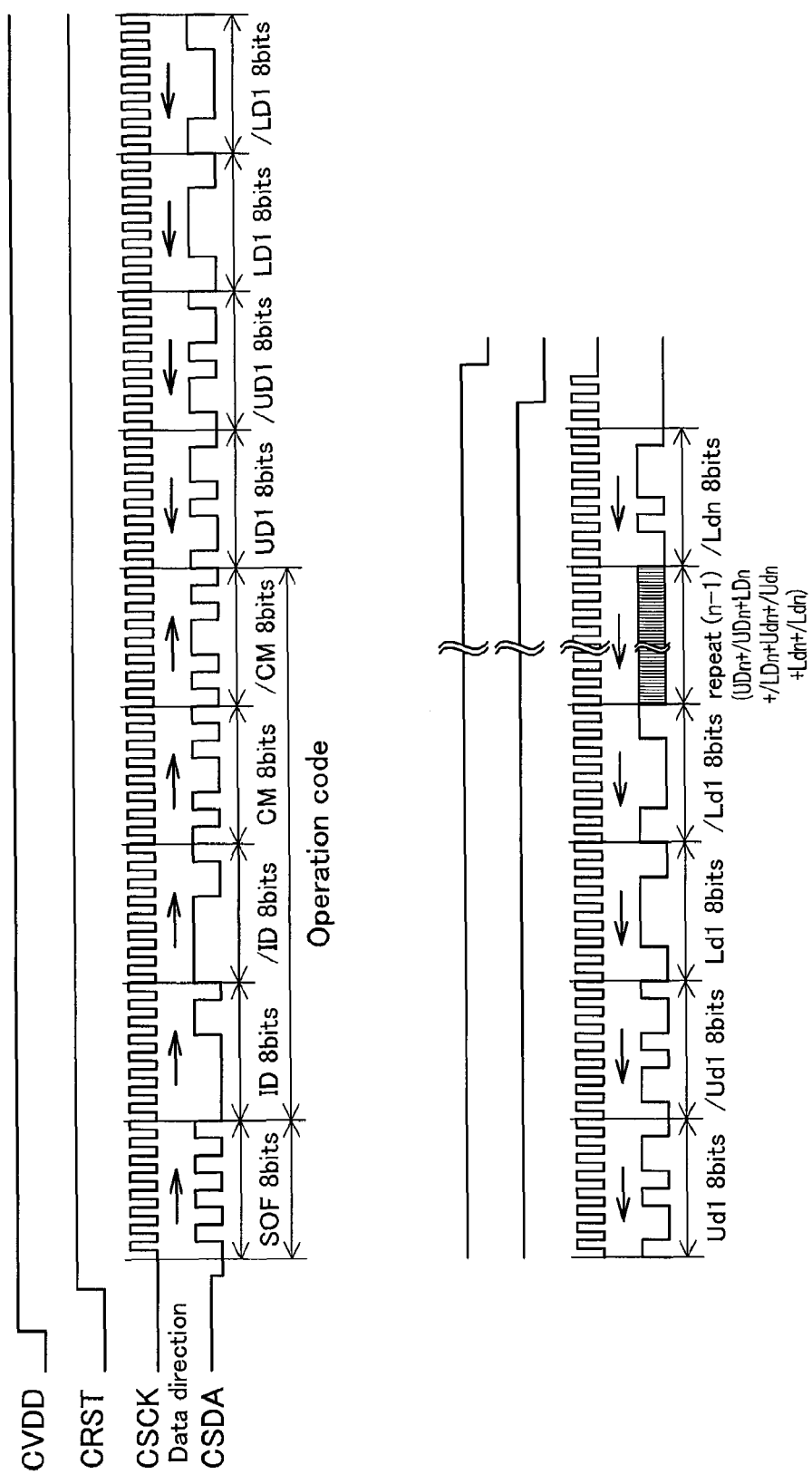
FIG. 9 is a timing chart schematically depicting signals exchanged between a communication process module and a memory control circuit during a read operation from a memory device.
Figure 10:
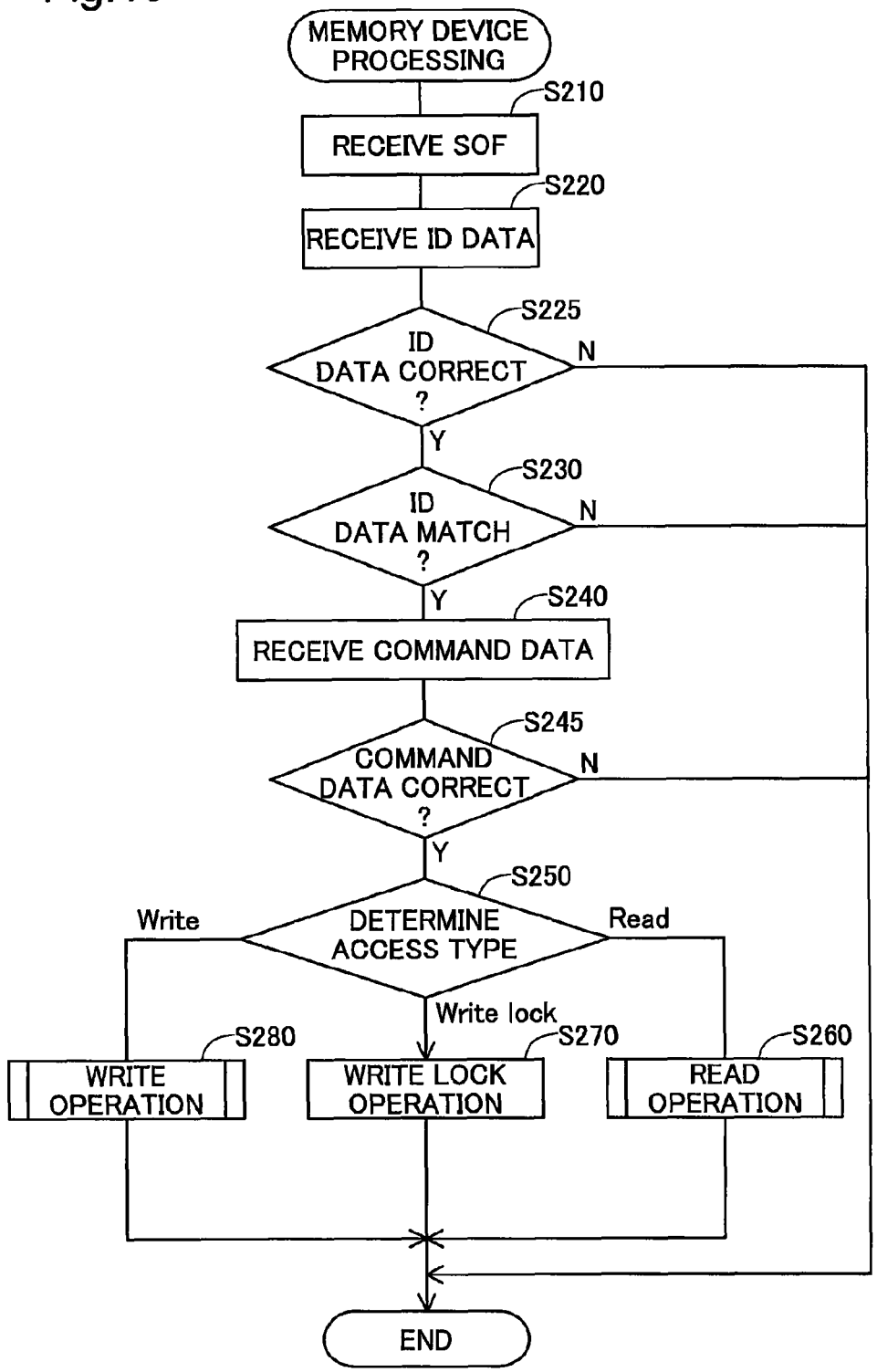
FIG. 10 is a flowchart schematically depicting a processing routine of a read operation from a memory device on the memory.

Read Operation from Memory Device:

FIG. 8 is a flowchart depicting the processing routine of a read operation from the memory device 130, executed by the sub-controller 50 of the printer 20. FIG. 9 is a timing chart schematically depicting signals exchanged between the communication process module 55 of the printer 20 and the memory control circuit 136 of the memory device 130 during a read operation from the memory device 130. In FIG. 9, an example of a power supply voltage CVDD, a reset signal CRST, a clock signal CSCK, and a data signal CSDA is depicted. The power supply voltage CVDD is a signal that appears on the first power supply line LCV connecting the sub-controller 50 and the memory device 130, and is supplied to the memory device 130 by the sub-controller 50. The reset signal CRST is a signal that appears on the reset signal line LR1 connecting the sub-controller 50 and the memory device 130, and is supplied to the memory device 130 by the sub-controller 50. The clock signal CSCK is a signal that appears on the clock signal line LC1 connecting the sub-controller 50 and the memory device 130, and is supplied to the memory device 130 by the sub-controller 50. The data signal CSDA is a signal that appears on the data signal line LD1 connecting the sub-controller 50 and the memory device 130. In FIG. 9, the data direction of the data signal CSDA is indicated as well. The rightward pointing arrows represent the direction in which the sub-controller 50 is at the sending side and the memory device 130 is at the receiving side. The leftward pointing arrows represent the direction in which the sub-controller 50 is at the receiving side and the memory device 130 is at the sending side. In the present embodiment, the memory device 130 sends and receives data synchronously with the rise of the clock signal CSCK presented to it by the sub-controller 50. Sending and receiving of data takes place when the clock signal CSCK rises and the level of the data signal on the data terminal of the memory device 130 has a valid value for sending or receiving of data. FIG. 10 is a flowchart schematically depicting the processing routine an operation executed by the memory control circuit 136 on the memory side.

The main controller 40 of the printer 20, via the bus BS, sends the sub-controller 50 a Read command instructing that a read operation from the memory device 130 of the ink cartridge 100 be carried out. The communication process module 55 supplies the power supply voltage CVDD to each of the ink cartridges 100 via the first power supply line LCV. Specifically, the memory device 130 of each of the ink cartridges 100 is supplied with operating voltage, thereby placing the memory device 130 in the operational state. After supplying the power supply voltage CVDD, a low level reset signal is supplied to initialize the memory devices 130. Because the reset signal remains at low level since the time that the previous access ended, it is at low level even before the power supply voltage CVDD is supplied to the memory device 130. When the communication process module 55 of the sub-controller 50 receives the Read command, the read operation depicted in the flowchart of FIG. 8 starts.

When the read operation starts, the communication process module 55 transitions the reset signal CRST from low level to high level, and transmits a clock signal CSCK of prescribed frequency (FIG. 9). When the reset signal CRST rises from low level to high level, the memory device 130 goes into a standby state to accept a data signal CSDA from the communication process module 55.

The communication process module 55 first transmits SOF (Start Of Frame) data as a data signal CSDA (FIG. 8: Step S102, FIG. 9). The SOF data is an 8-bit data signal having a prescribed waveform, and transmitted in sync with the clock signal CSCK. The purpose of transmitting the SOF is to notify the memory device 130 of the start of communication.

Following the SOF data, the communication process module 55 sends an operation code. An operation code is a sequence of identification data and command data. Command data is data for indicating a particular type of access (e.g. a read or write operation) to the memory device 130. The communication process module 55 sends identification data as a data signal CSDA (FIG. 8: Step S104). The identification data is identification information that specifies the memory device 130 of an ink cartridge 100 that is targeted for a read operation, and includes identification data of 8 bits and inverted identification data of 8 bits (FIG. 9). Here, the inverted data is data of the same size (same number of bits) as the original data, but in the data the value of each bit of the original data is inverted. For example, if an m-th value (m is a natural number) of the original data is a "1", in the inverted data, the m-th value becomes a "0"; and if an m-th value of the original data is a "0", in the inverted data, the m-th value becomes a "1". Hereinbelow where original data is denoted by the symbol A, the inverted data thereof is denoted by a preceding/(slash symbol), i.e. /A. For example, for original data A=(01001001), the inverted data /A=(10110110). The inverted identification data is generated by the main controller 40 or the communication process module 55 on the basis of the identification data. By duplicating the identification data in this way, unintended operation of the memory device 130 of an ink cartridge 100 not targeted for operation may be avoided.

Following the identification data, the communication process module 55 sends command data as a data signal CSDA (FIG. 8: Step S106). Command data includes original command data of 8 bits and inverted command data of 8 bits (FIG. 9). Here, because the operation is a read operation from the memory device 130 to the sub-controller 50, the command data sent in the operation is a command indicating a read operation (Read command). In the original command data CM, of the 8 bits, the upper 4 bits and the lower 4 bits have an inverted relationship to each other. For example, if the upper 4 bits of the original command data CM are "0110" the lower 4 bits of the original command data CM are "1001", and the inverted command data /CM are "10010110". The inverted command data are generated by the main controller 40 or the communication process module 55 on the basis of the original command data. By providing such redundancy of command data, erroneous operation of the memory device 130 can be avoided.

In synchronization with the next rise of the clock signal CSCK following the end of transmission of the command data, reception of the read data sent from the memory device 130 starts. The communication process module 55 receives read data including data that is read out from a row of the memory device 130. To discuss in more detail, the communication process module 55 receives a unit of read data equivalent to 8 bits×8=64 bits, doing so sequentially one bit at a time in sync with rise of the clock signal CSCK (FIG. 8: Step S108, FIG. 9). The 64-bit unit of read data consist of original data upper 8 bits UDn (n is a natural number); inverted original data upper 8 bits /UDn representing inverted data of the original data upper 8 bits UDn; original data lower 8 bits LDn; inverted original data lower 8 bits /LDn representing inverted data of the original data lower 8 bits LDn; mirror data upper 8 bits Udn representing mirror data of the original data upper 8 bits UDn; inverted mirror data upper 8 bits /Udn representing inverted original data upper 8 bits Udn; mirror data lower 8 bits Ldn representing mirror data of the original data lower 8 bits LDn; and inverted mirror data lower 8 bits /Ldn representing inverted original data lower 8 bits Ldn (FIG. 9).

The 16-bit data having the original data upper 8 bits UDn as its upper bits and the original data lower 8 bits LDn as its lower bits are also referred to as original data Dn. The 16-bit data having the inverted original data upper 8 bits /UDn as its upper bits and the inverted original data lower 8 bits /LDn as its lower bits are also referred to as inverted data /Dn. The 16-bit data having the mirror data upper 8 bits Udn as its upper bits and the mirror data lower 8 bits Ldn as its lower bits are also referred to as mirror data dn. The 16-bit data having the inverted mirror data upper 8 bits /Udn as its upper bits and the inverted mirror data lower 8 bits /Ldn as its lower bits are also referred to as inverted mirror data /dn. That is, the unit of read data can be said to represent data made up of original data Dn, inverted data /Dn, mirror data dn, and inverted mirror data /dn. Ultimately, by repeating reception of units of read data n times, the communication process module 55 of the sub-controller 50 receives all of the data that is to be read (discussed later). It should be noted that the original data Dn and mirror data dn are read out from the memory cell array 132 while the inverted data /Dn and inverted mirror data /dn are generated from the original data Dn and mirror data dn by the inverted data generation module M18.

When a unit of read data is received, the communication process module 55 temporarily stores the unit of read data in a register (not shown) and executes the process described below. First, from the unit of read data, the communication process module 55 decides whether or not the exclusive OR of an m-th value of the original data Dn and an m-th value of the inverted mirror data /dn is true "1" for all values of m ($1 \leq m \leq 16$) (FIG. 8: Step S110). In general, the output of an exclusive OR circuit is true "1" if the two inputs have different values, and is false "0" if the two inputs have an identical value. If the output of the exclusive OR operation is true for all 16 bits, i.e. if 1111111111111111=FFFF in hexadecimal notation (FIG. 8: Step S110: YES), the communication process module 55 decides that the communication status and the memory cells that have been read are normal, and stores the original data Dn and the inverted mirror data /dn in an allocated memory area (discussed above) of the SRAM 551 (FIG. 8: Step S120).

If on the other hand the output of the exclusive OR operation is false "0" for any of the 16 bits, i.e. if not FFFF (FIG. 8: Step S110: NO), the communication process module 55 decides whether or not the exclusive OR of an m-th value of the original data Dn and an m-th value of the inverted data /Dn is true "1" for all values of m ($1 \leq m \leq 16$) (FIG. 8: Step S112). If the output of the exclusive OR operation is FFFF (FIG. 8: Step S112: YES), the communication process module 55 decides whether or not the exclusive OR of an m-th value of the mirror data dn and an m-th value of the inverted mirror data /dn is true "1", for all values of m ($1 \leq m \leq 16$) (Step S114). If the exclusive OR operation outcomes for all the m-th values of the original data Dn and all the m-th values of the inverted data /Dn are not FFFF (FIG. 8: Step S112: NO), or if the exclusive OR outcomes for all the m-th values of the mirror data dn and all the m-th values of the inverted mirror data /dn are not FFFF (FIG. 8: Step S114: NO), the communication process module 55 decides that there is a communication error, and stores the original data Dn and the inverted mirror data /dn to a memory area allocated in the SRAM 551, as well as saving a prescribed communication error code indicating the communication error to the error code register 553 in the communication process module 55 (FIG. 8: Step S118), then carry out a prescribed error process (Step S124) and terminate the read operation. The error code register 553 may also store included information indicating whether the communication error occurred in communication of the original data from the memory device (corresponds to NO in S112) or whether the communication error occurred in communication of the mirror data from the memory device (corresponds to NO in S114). The prescribed error process may involve notifying the main controller 40 of the communication error, or that the read operation is ceased, for example. The prescribed error process may also be omitted. By referring to the communication error code stored in the SRAM 551, the main controller 40 acknowledges the occurrence of a communication error. If the main controller 40 further acknowledges whether the communication error is occurred in the original data or the mirror data, the data in which no communication error is occurred may be utilized for processes executed by the main controller 40.

If the exclusive OR operation outcomes for all the m-th values of the original data Dn and all the m-th values of the inverted data /Dn are FFFF (FIG. 8: Step S112: YES), and if the exclusive OR outcomes for all the m-th values of the mirror data dn and all the m-th values of the inverted mirror data /dn are FFFF (FIG. 8: Step S114: YES), there is a high probability that the data that was stored in the original data area of the memory device 130 and that the data that was stored in the mirror data area do not have consistency; therefore, the communication process module 55 decides that a memory cell error is occurred in the memory device 130, and then stores the original data Dn and the inverted mirror data /dn to an allocated memory area in the SRAM 551, as well as saving a prescribed communication error code indicating the cell error to the error code register 553 in the communication process module 55 (FIG. 8: Step S116). A cell error is a problem whereby, in either a memory cell storing original data targeted for the operation or a memory cell storing mirror data targeted for the operation, the memory cell per se becomes damaged so that the saved information can no longer be saved correctly.

Once Step S120 or Step S116 is executed, the communication process module 55 decides whether all data targeted for the read operation are read out (FIG. 8: Step S122). If all of the data to be read are read (FIG. 8: Step S122: YES), the communication process module 55 terminates the read operation. Once the communication process module 55 terminates the read operation as depicted in FIG. 9, it transits the reset signal CRST from high level to low level, and ceases to supply the clock signal CSCK. Once the communication process module 55 ceases to supply the clock signal CSCK, it then ceases to supply the power supply voltage CVDD. If not all of the data to be read are read yet (FIG. 8: Step S122: NO), the communication process module 55 returns to Step S108 and repeats the process discussed above for the next unit of read data. For example, once the above process is carried out for the first unit of read data D1, /D1, d1, /d1, the above process is then carried out for the second unit of read data D2, /D2, d2, /d2. In the present embodiment, once reading of Row A1 is complete, reading of Row A2 takes place. Read operations are repeated until the information in the rows storing the information that the main controller 40 intends to read is read out.

The discussion now turns to processing that takes place on the memory device 130 (memory device processing) in response to a read operation from the memory device 130 at the communication process module 55 discussed above. Because processing executed in the memory device 130 is the same up to step of receiving the operation code and step of parsing the command data (type of access), the discussion is not limited to read operations and includes other processes (e.g. write operations) as well. The memory device 130 receives input of power supply voltage CVDD from the sub-controller 50 and is activated. The memory device 130 then initializes itself in response to input of a low level reset signal CRST. After receiving supply of power supply voltage CVDD, because the reset signal CRST is low (FIG. 9), the memory device 130 goes into the initialized state and initiates memory device side processing.

After initialization of the memory device 130 is carried out, the address counter M13 is set to its initial value at the time of initialization, and the various registers are reset to their initial values as well. Additionally, the data send/receive module M15 of the memory device 130 sets the send/receive direction for data exchanged via the data terminal to the direction in which the memory device 130 receives data from the sub-controller 50. The read/write control module M14 sets the data transfer direction vis-à-vis the ferroelectric memory array 132 to the data read direction.

As depicted in FIG. 10, once processing is initiated on the memory device, the memory control circuit 136 of the memory device 130 receives SOF data as a data signal CSDA (FIG. 10: Step S210). Following the SOF data, the memory control circuit 136 receives identification data (FIG. 10: Step S210). Once the identification data is received, the ID comparator module M11 determines whether the received identification data is correct (Step S225). Specifically, for the identification data and the inverted identification data included in the received identification data, the ID comparator module M11 takes the exclusive OR one bit at a time, and determine whether all output values of the exclusive OR are 1's. That is, it determines whether there are any communication errors in the received identification data. If there are no communication errors, the received identification data is deemed to be correct, whereas if communication errors are found, the received identification data is deemed to be not correct. In the event that the ID comparator module M11 decides that the received identification data is not correct (FIG. 10: Step S225: NO), it terminates with no further processing.

If on the other hand the ID comparator module M11 decides that the received identification data is correct (Step S225: YES), it then decides whether the ID number (identification information) that is assigned to the memory device 130 itself matches the received identification data (FIG. 10: Step S230). At this time, because the address counter M13 is currently selecting Row A0 by the initialization, the read/write control module M14 reads out the ID number (identification information) that is stored in Row A0. The ID comparator module M11 then accepts the ID number (identification information) that is assigned to the memory device in the first row (FIG. 7: Row A0) of the memory area read out by the read/write control module M14, and compares bit for bit the ID number (identification information) assigned to the memory device with the identification data contained in the identification data that has been sent from the communication process module 55. If the ID number (identification information) assigned to the memory device and the received identification data do not match, the ID comparator module M11 decides that the ID number (identification information) assigned to the memory device and the received identification data do not match.

If the ID comparator module M11 decides that the ID number (identification information) assigned to the memory device does not match the received identification data (FIG. 10: Step S230: NO), the memory control circuit 136 terminates with no further processing. If the ID comparator module M11 decides that the ID number (identification information) assigned to the memory device matches the received identification data (FIG. 10: Step S230: YES), the memory control circuit 136 receives the command data that is transmitted as a data signal CSDA subsequent to the identification data (FIG. 10: Step S240). Once the command data is received, the command parse module M12 of the memory control circuit 136 first determines whether the received command data is correct (Step S245). Specifically, the command parse module M12 decides whether the upper 4 bits and the lower 4 bits of the original command data contained in the received command data are inverted data of one another. The command parse module M12 additionally decides whether the upper 4 bits and the lower 4 bits of the inverted command data contained in the received command data are inverted data of one another. The command parse module M12 also takes the exclusive OR one bit at a time for the original command data and the inverted command data, and decide whether or not all output values of the exclusive OR are 1's. If the upper 4 bits and the lower 4 bits of the original command data contained in the received command data are found to be inverted data of one another, the upper 4 bits and the lower 4 bits of the inverted command data contained in the received command data are found to be inverted data of one another, and an exclusive OR result of 1 is obtained for all bits of the original command data and the inverted command data, the command parse module M12 decides that the received command data is correct (devoid of communication errors). If on the other hand the upper 4 bits and the lower 4 bits of the original command data contained in the received command data are not found to be inverted data of one another, or the upper 4 bits and the lower 4 bits of the inverted command data contained in the received command data are not found to be inverted data of one another, or the exclusive OR result is not 1 for any bit of the original command data and the inverted command data, the command parse module M12 decides that the received command data is not correct (contains communication errors).

In the event of a decision that the command data is not correct (Step S245: NO), the memory control circuit 136 terminates processing. If on the other hand it is decided that command data is correct (Step S245: YES), the command parse module M12 of the memory control circuit 136 parses the received command and determine the type of access (FIG. 10: Step S250). Here, possible types of command data includes at least a Write command, a Read command, and a Write Lock command. A Write command is a command instructing that data be written into the ferroelectric memory array 132. A Read command is a command instructing that data be read from the ferroelectric memory array 132. A Write Lock command is a command instructing that of a write lock operation, discussed later, be executed on the memory device; the command instructs that a Write Lock flag, indicating that a specified row of the ferroelectric memory cell array 132 is a write-prohibited row, be written into the control area, in order to prohibit write operations to the row from the communication process module 55.

If the command directed to the memory device 130 does not correspond to any of the above types of command, the command parse module M12 decides that the command data is not parsable. If the command parse module M12 decides that the command data is not parsable, the memory control circuit 136 proceeds to terminate, and do nothing (not shown).

If the command parse module M12 decides that the command indicated by the command data is a Read command, the memory control circuit 136 executes a read operation on the memory device (FIG. 10: Step S260). If the command parse module M12 decides that the command indicated by the command data is a Write command, the memory control circuit 136 executes a write operation on the memory device (FIG. 10: Step S280). If the command parse module M12 decides that the command indicated by the command data is a Write Lock command, the memory control circuit 136 executes a write lock operation on the memory device (FIG. 10: Step S270). If a read operation on the printer 20 depicted in FIG. 8 is being carried out by the communication process module 55, the memory control circuit 136 receives a Read command as command data; and as long as no communication error is occurred, the command parse module M12 decides that the command indicated by the command data is a Read command, and the memory control circuit 136 executes the read operation on the memory device. The steps of the flowchart depicted in FIG. 10 may be executed in a different order or in parallel, as long as no conflicts occurs in the process. For example, the memory control circuit 136 may decide if the identification data is correct after confirming a match between the identification data stored in the memory device and the identification data supplied from the communication process module 55; or it may decide if the identification data is correct while receiving the command data in a parallel process.

Figure 11:
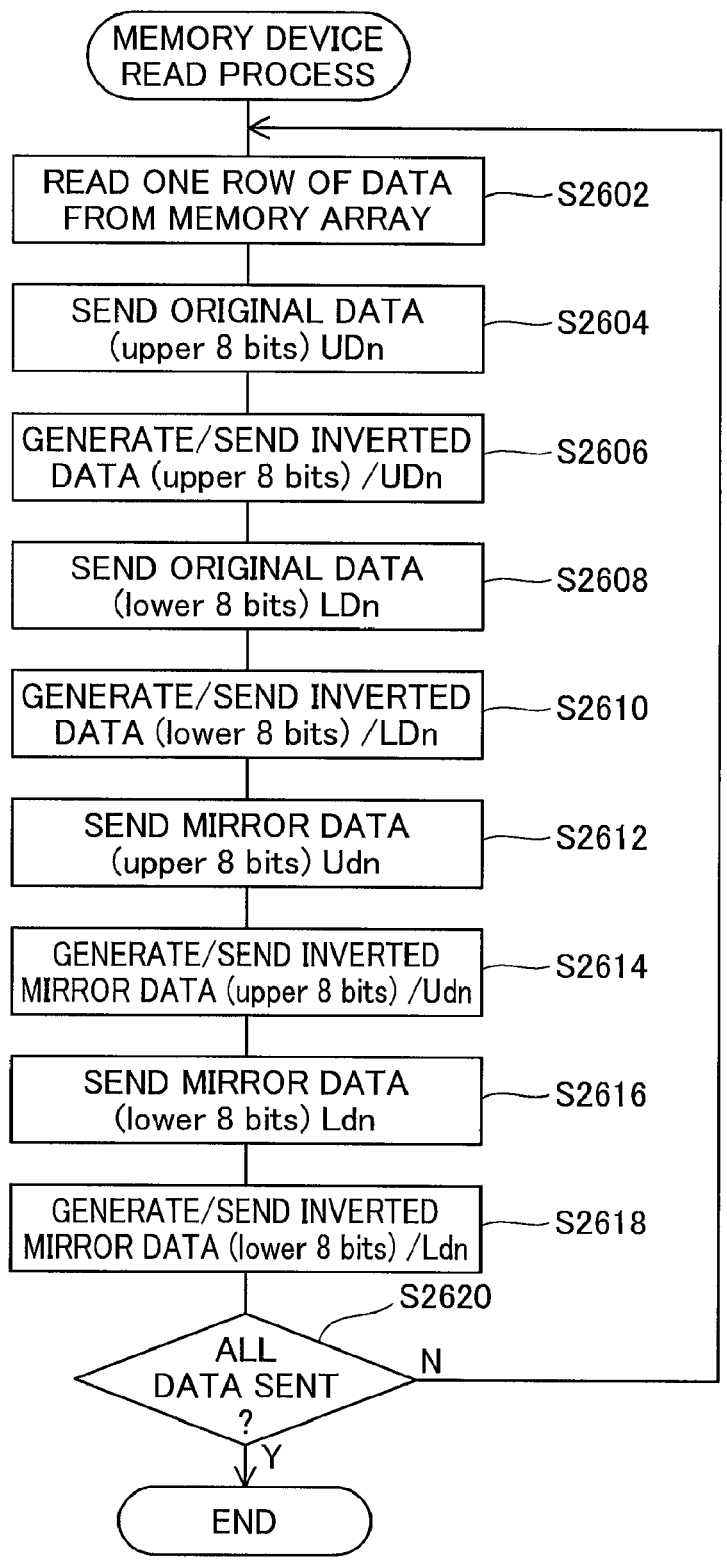
FIG. 11 is a flowchart depicting the processing routine of a read operation taking place on the memory device.

FIG. 11 is a flowchart depicting the processing routine of a read operation (FIG. 10: Step S260) on the memory device. The read/write control module M14 of the memory control circuit 136 reads data from the ferroelectric memory cell array 132 according to the address that is selected by the output of the address counter M13, and send it as a data signal CSDA to the communication process module 55. After the operation code is received, if the command indicated by the command data is a Read command, the data send/receive module M15 sets the send/receive direction of data to be exchanged via the data terminal to the direction of sending data from the memory device 130 to the sub-controller 50. Moreover, if the command indicated by the command data is a read command, the counter control module M16 supplies a control signal to the address counter M13 specifying Row A1 as the initial row targeted for reading. Then, based on the address specified by the count value of the address counter M13, the read/write control module M14 reads out data into a register, not shown, from the ferroelectric memory array 132 in 1-row (32-bit) increments (FIG. 11: Step S2602). The first row to be read out is Row A1 shown in FIG. 7.

From the 32 bits that were read into the register, the data send/receive module M15 first selects the upper 8 bits as the original data upper 8 bits UDn mentioned previously, and sends these to the sub-controller 50 (FIG. 11: Step S2604). Next, the inverted data generation module M18 inverts each bit of the original data upper 8 bits UDn to generate inverted original data upper 8 bits /UDn. The data send/receive module M15 then sends the generated inverted original data upper 8 bits /UDn to the sub-controller 50 (FIG. 11: Step S2606). Next, from the 32 bits that were read into the register, the data send/receive module M15 selects the 8 bits from the 9th to 16th bits as the original data lower 8 bits LDn mentioned previously, and sends these to the sub-controller 50 (FIG. 11: Step S2608). Then, the inverted data generation module M18 inverts each bit of the original data lower 8 bits LDn to generate inverted original data lower 8 bits /LDn. The data send/receive module M15 then sends the generated inverted original data lower 8 bits /LDn to the sub-controller 50 (FIG. 11: Step S2610). Next, from the 32 bits that were read into the register, the data send/receive module M15 selects the 8 bits from the 17th to 24th bits as the mirror data upper 8 bits Udn mentioned previously, and sends these to the sub-controller 50 (FIG. 11: Step S2612). Then, the inverted data generation module M18 inverts each bit of the mirror data upper 8 bits Udn to generate inverted mirror data upper 8 bits /Udn. The data send/receive module M15 then sends the generated inverted mirror data upper 8 bits /Udn to the sub-controller 50 (FIG. 11: Step S2614). Next, from the 32 bits that were read into the register, the data send/receive module M15 selects the 8 bits from the 25th to 32nd bits as the mirror data lower 8 bits Ldn mentioned previously, and sends these to the sub-controller 50 (FIG. 11: Step S2616). Then, the inverted data generation module M18 inverts each bit of the mirror data lower 8 bits Ldn to generate inverted mirror data lower 8 bits /Ldn. The data send/receive module M15 then sends the generated inverted mirror data lower 8 bits /Ldn to the sub-controller 50 (FIG. 11: Step S2618).

After sending of the 32 bits that are read into the register is finished, if transmission of all of the data that is requested to be read by the sub-controller 50 is not completed (FIG. 11: Step S2620: NO), the memory control circuit 136 returns to Step S2602, and repeats the process of Steps S2602 to S2618 for the data of the next row (32 bits) of the ferroelectric memory array 132. Once transmission of all of the data is completed, the memory control circuit 136 terminates the process.

In the event that the ID comparator module M11 or the command parse module M12 determines that the ID data or the command data CM includes a communication error, and the memory control circuit 136 terminates processing without any meaningful process accordingly, the memory device 130 does not transmit any data during the read data transmission period. As described previously, the data signal line LD1 is maintained at a low level by the resistor R1 of the sub-controller 50 when there is no data transmission between the sub-controller 50 and the memory device 130. Then the communication process module 55 receives low level data during the entire period for receiving the original data Dn and the inverted data /Dn, whereby the decision of Step S112 in FIG. 8 is NO, and the communication process module 55 decides that a communication error is occurred. Through the read operation described above, original data Dn and inverted mirror data /dn are stored in the SRAM 551. If an error is occurred, a communication or cell error code is stored in the error code register 553 of the communication process module 55. The original data Dn and inverted mirror data /dn, as well as any communication or cell error code, stored in the communication process module 55 are retrieved by the main controller 40. For original data Dn and inverted mirror data /dn with no associated error code, the main controller 40 uses the original data Dn to carry out a prescribed control process (e.g. checking the remaining ink level or notifying the user of the remaining ink level). In the case of original data Dn and inverted mirror data /dn with an associated communication error code, the main controller 40 performs a communication error response process, for example, displaying on the display panel of the console portion 70 a message prompting the user to recheck installation of the ink cartridge 100. Or, in the case of original data Dn and inverted mirror data /dn having an associated cell error code, the main controller 40 performs a parity check of the original data Dn and the inverted mirror data /dn, respectively, for which the cell error is diagnosed. As noted above, the original data Dn and the inverted mirror data /dn include actual data and parity data (FIG. 7). The main controller 40 selects the data, from the original data Dn and the inverted data /dn with the associated cell error, in which the 15 bits of actual data and the 1 bit of parity data have consistency, and uses it to carry out a prescribed control process. If as a result of the parity check of the original data Dn and inverted mirror data /dn with the associated cell error, both the original data Dn and inverted mirror data /dn are found to have a parity error, or if both have parity consistency, a message alerting the user of an ink cartridge 100 memory error is displayed on the display panel of the console portion 70. Also, where readout from the memory device 130 is carried out for the purpose of verifying the write result of data written into the memory device 130, the write data which is kept by the main controller 40 may be compared with the original data Dn and inverted mirror data /dn having the associated cell error, to determine whether the data is correct. In the present embodiment, in Step S2602, data stored in one row is read out from the memory cell array 132, but readout of data from the memory cell array 132 need not take place in 1-row units, provided that subsequent to reception of the command data, data can be sent in sync with the clock signal provided to the memory device 130, in order from Step S2604 to Step S2618.

Figure 12:
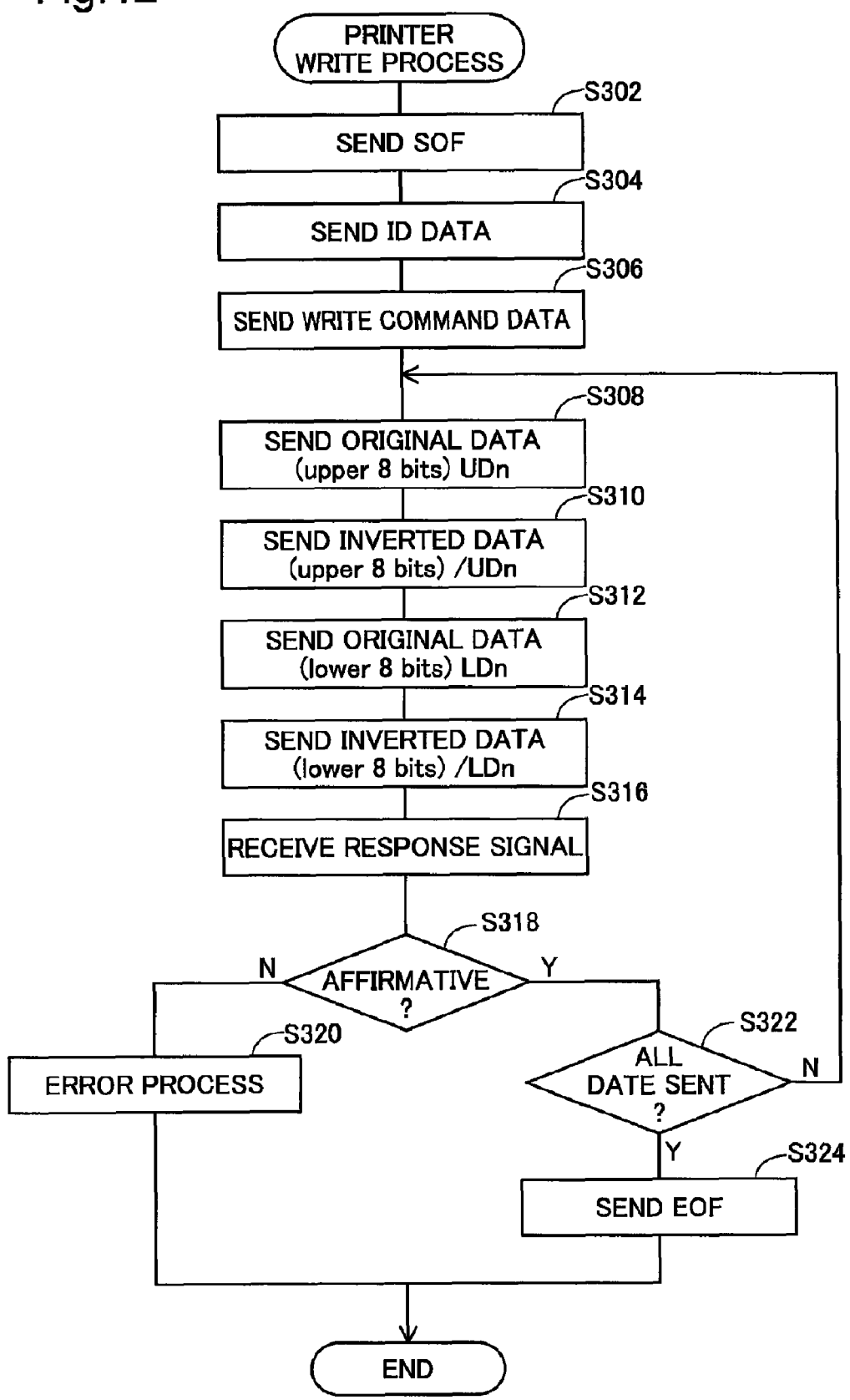
FIG. 12 is a flowchart depicting the processing routine of a write operation to a memory device taking place on the printer.
Figure 13:
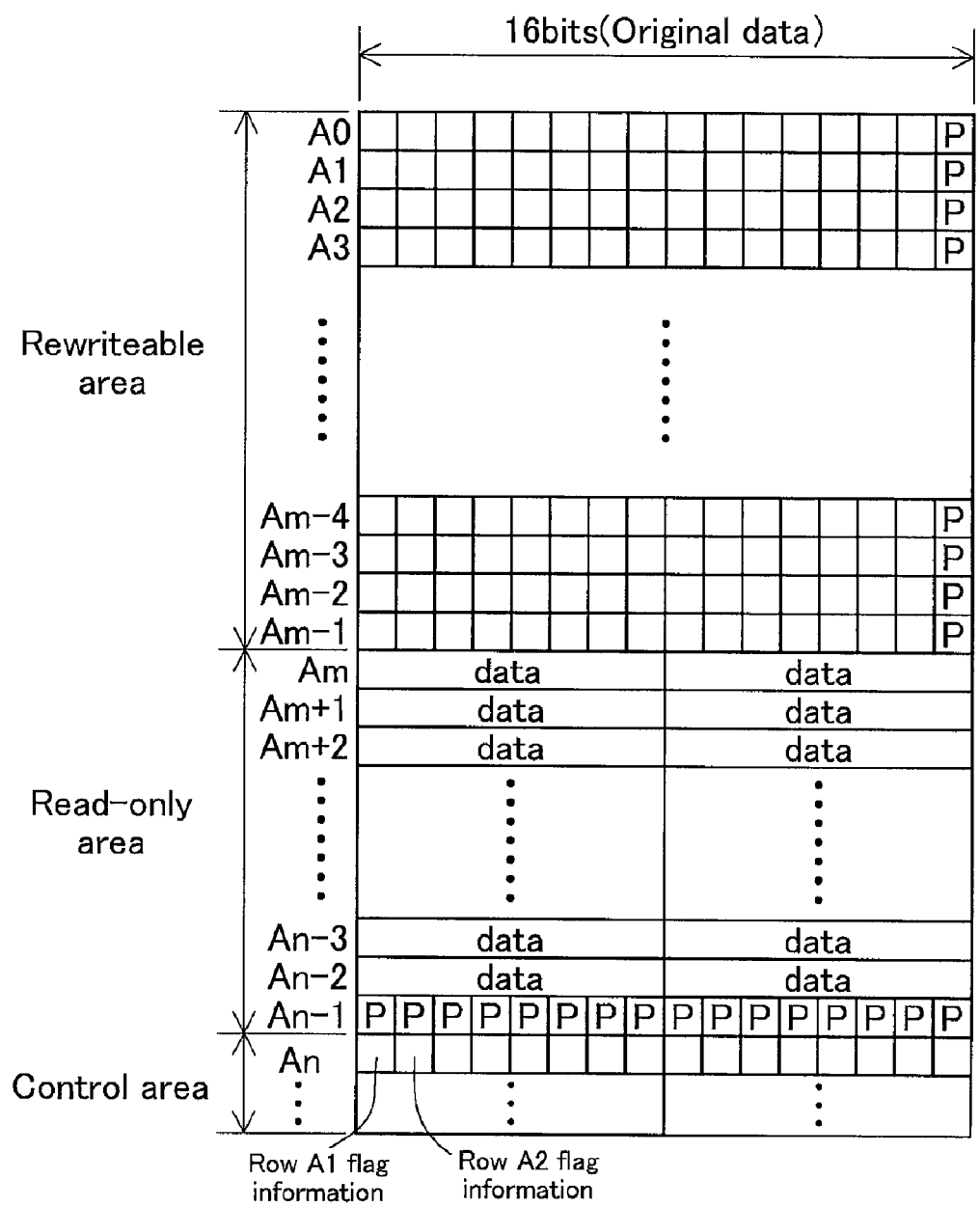
FIG. 13 schematically depicts a memory map recognized on the printer during a write operation to a memory device.
Figure 14:
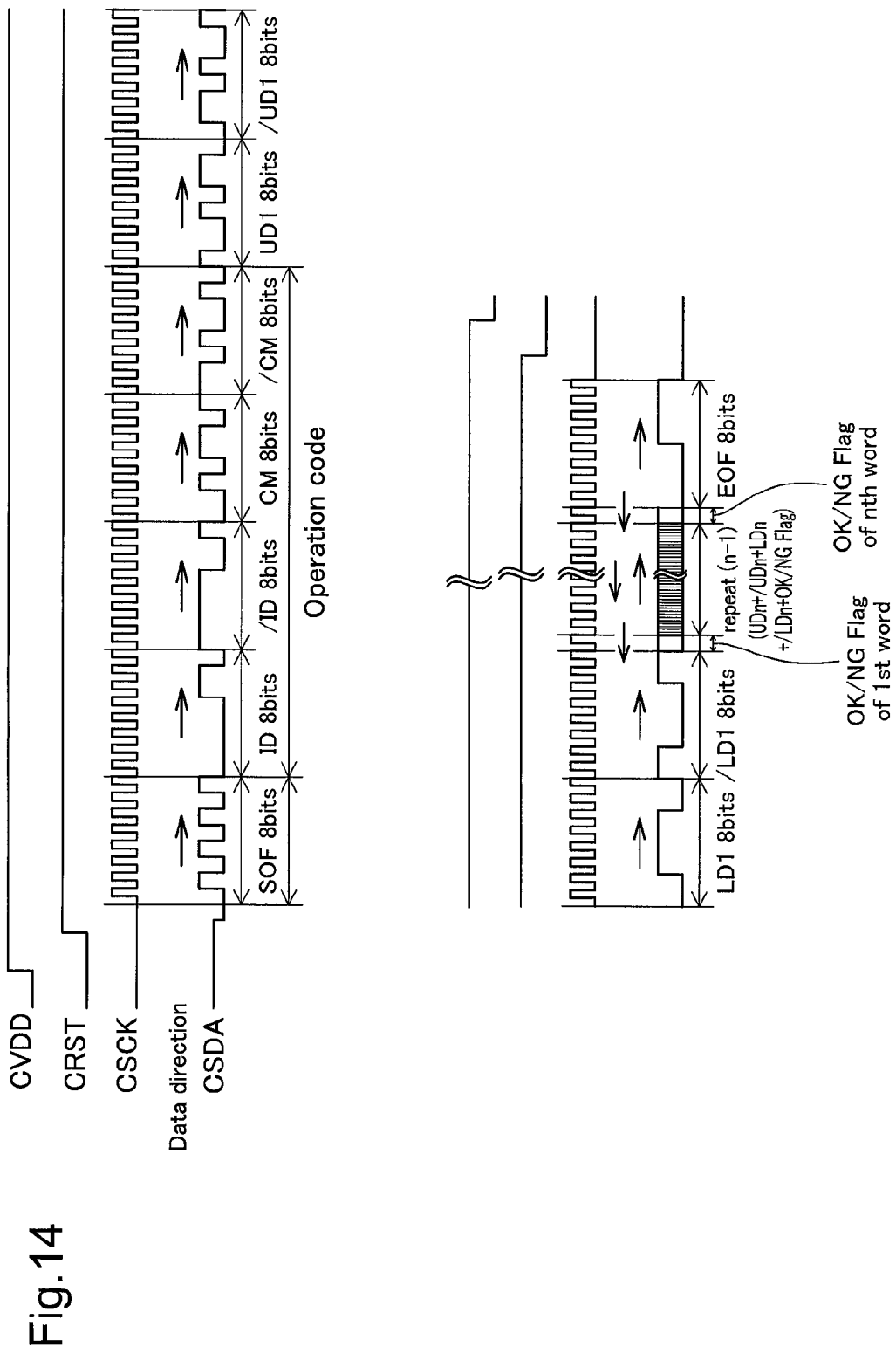
FIG. 14 is a timing chart schematically depicting signals exchanged between a communication process module and a memory control circuit during a write operation to a memory device.
Figure 15:
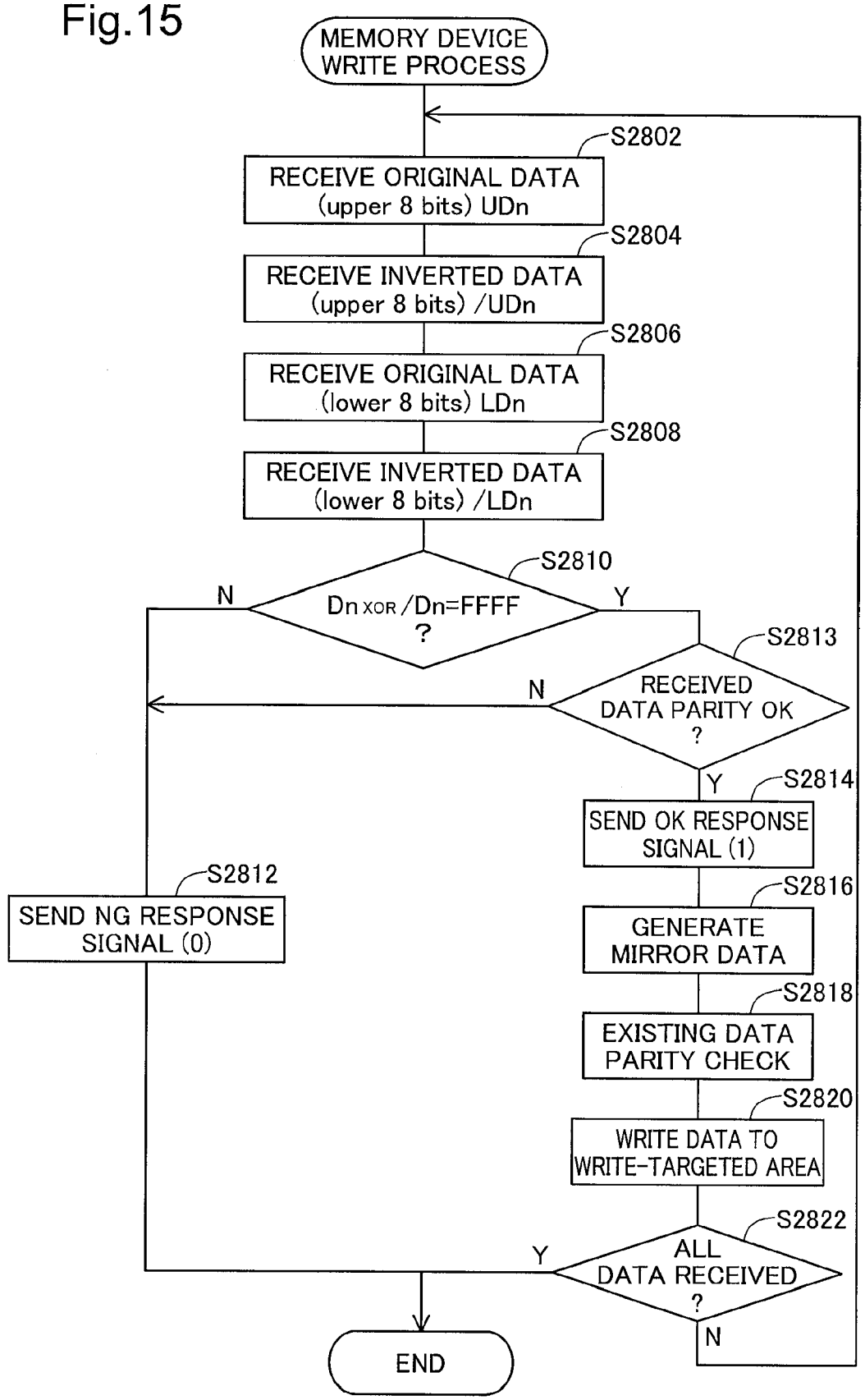
FIG. 15 is a flowchart depicting the processing routine of a write operation in a memory device.

Write Operation to Memory Device:

FIG. 12 is a flowchart depicting the processing routine of a write operation to the memory device 130, executed by the sub-controller 50 on the printer 20. FIG. 13 is a drawing schematically depicting a memory map of the memory device 130 recognized by the main controller 40 on the printer 20 during a write operation to the memory device 130. FIG. 14 is a timing chart schematically depicting signals exchanged between the communication process module 55 of the printer 20 and the memory control circuit 136 of the memory device 130 during a write operation to the memory device 130. In FIG. 14, as in FIG. 9, the power supply voltage CVDD, the reset signal CRST, the clock signal CSCK, the data signal CSDA, and the data direction are shown. FIG. 15 is a flowchart depicting the processing routine of a write operation executed by the memory control circuit 136 of the memory device 130.

Via the bus BS, the main controller 40 of the printer 20 writes to the SRAM 551 in the sub-controller 50, the data that is to be written into the memory device 130 of a particular ink cartridge 100. Specifically, this data is written into write target rows which are allocated in the SRAM 551 for writing of original data corresponding to the ferroelectric memory cell array 132 of the memory device 130. During a write operation, the main controller 40 recognizes that the memory device 130 is a memory in which one row equals 16 bits. Thus, the data that is to be written into the memory device 130 is divided into 16-bit units, in which 16-bit unit the upper 15 bits are actual data and the lower 1 bit is parity data. The parity data may also be generated by the main controller 40, appended to the upper 15 bit actual data, and written into the SRAM 551 as data of 16 bits in total. Alternatively, the parity data may also be generated by the sub-controller 50, and appended each time that 15-bit data is written into the SRAM 551 by the main controller 40. The main controller 40 then transmits to the sub-controller 50 via the bus a Write command instructing that the write-targeted memory device 130 be notified, and that the data that is written into the SRAM 551 be written into the memory device 130 that is targeted for the write operation. Upon receiving the Write command, the sub-controller 50 supplies each ink cartridge 100 with the power supply voltage CVDD via the first power supply line LCV, placing the memory device 130 of each ink cartridge 100 in the operable state. After the power supply voltage CVDD is supplied by the sub-controller 50, a low level reset signal CRST is supplied by the sub-controller 50 and the memory devices 130 is initialized. Because the reset signal remains at low level since the time that the previous access ended, it is at low level even before the power supply voltage CVDD is supplied to the memory devices 130. The communication process module 55 of the sub-controller 50 then initiates the write operation shown in the flowchart of FIG. 12.

During write operations, the communication process module 55 recognizes the memory map depicted in FIG. 13 as the memory map of the memory device 130. That is, during write operations, in the actual memory map corresponding to the actual ferroelectric memory array (FIG. 7), the communication process module 55 recognizes only the presence of the block storing the original data (the left hand block in FIG. 7), and does not recognize the presence of the block storing mirror data. The communication process module 55 recognizes that multiple rows each consisting of a memory area containing 16 bits per row are arrayed in the block storing the original data.

When the write operation starts, the communication process module 55 transitions the reset signal CRST from low level to high level, and transmits a clock signal CSCK of a prescribed frequency (FIG. 14). When the reset signal CRST rises from low level to high level, the memory control circuit 136 of the memory device 130 goes into a standby state to accept a data signal CSDA from the communication process module 55.

As in the read operation described earlier, the communication process module 55 first transmits SOF data as a data signal CSDA (FIG. 12: Step S302, FIG. 14). As in the read operation described earlier, following the SOF data, the communication process module 55 sends identification data as a data signal CSDA (FIG. 12: Step S304, FIG. 14). Following the identification data, the communication process module 55 sends command data as a data signal CSDA (FIG. 14: Step S306, FIG. 14). The command data sent in the present operation is a Write command indicating a write operation.

In sync with the next rise of the clock signal CSCK following the end of transmission of the command data, the communication process module 55 sends the write data so that the memory control circuit 136 of the memory device 130 receives the data one bit at a time. The write data is sent in row order starting from the data to be written into Row A1. Specifically, the communication process module 55 sequentially sends unit write data equivalent to 8 bits×4=32 bits (FIG. 14). A 32-bit unit of write data includes original data upper 8 bits UDn; inverted original data upper 8 bits /UDn representing inverted data of the original data upper 8 bits UDn; original data lower 8 bits LDn; and inverted original data lower 8 bits /LDn representing inverted data of the original data lower 8 bits LDn (FIG. 14). The communication process module 55 sends the total of 32 bits in the order of: original data upper 8 bits UDn, inverted original data upper 8 bits /UDn, original data lower 8 bits LDn, and inverted original data lower 8 bits /LDn (Steps S308 to S314).

In sync with the next rise of the clock signal CSCK following the end of transmission of a unit of write data, the communication process module 55 receives a 1-bit (either a "1" or a "0") response signal from the memory control circuit 136 (FIG. 12: Step S316, FIG. 14). A "1" (high level) response signal (hereinafter also called an OK response signal) is a signal indicating that a unit of write data was received correctly at the memory device 130, while a "0" (low level) response signal (hereinafter also called an NG response signal) is a signal indicating that a unit of write data may not be received correctly at the memory device 130. The reason for adopting a high level OK response signal in the response signal is that, as noted earlier, the data signal line LD1 is connected to low level potential via the pull-down resistor R1. This prevents that an high level OK response signal is erroneously input to the communication process module 55 due to an communication error caused, for example, by faulty contact between the data terminal 260 and the terminal 460 of the connection mechanism 400.

If the received response signal is not affirmative (FIG. 12: Step S318: NO), i.e. if the received response signal is NG response signal, the communication process module 55 carries out a prescribed error process (FIG. 12: Step S320) and terminate the write operation. The error process may involve, for example, trying to resend the same unit of write data, and if as a result of a certain number of retries only a NG response signal is obtained, notifying the main controller 40 of the error. The main controller 40 would then display on the display panel of the console portion 70 a message prompting the user to recheck installation of the ink cartridge 100 for example.

If on the other hand the received response signal is affirmative (FIG. 12: Step S318: YES), i.e. if an OK response signal is received, the communication process module 55 decides whether all of the data to be written to the memory device 130 has been sent (FIG. 12: Step S322). If all of the data to be written has been sent (FIG. 12: Step S322: YES), the communication process module 55 sends EOF (End of Frame) data to the memory device 130 (FIG. 12: Step S324), and terminate the write operation. Once the communication process module 55 terminates the write process as depicted in FIG. 14, it transits the reset signal CRST from high level to low level, and ceases to supply the clock signal CSCK. The EOF data may be 8-bit data for example, and may be either significant data or simple dummy data. If not all of the data to be written has been sent (FIG. 12: Step S322: NO), the communication process module 55 returns to Step S308 and repeats the process discussed above for the next unit of write data. For example, once the above process is carried out for the first unit of write data UD1, /UD1, LD1, /LD1, the communication process module 55 carries out the above process for the second unit of write data UD2, /UD2, LD2, /LD2 for example.

The discussion now turns to processing that takes place on the memory device 130 (memory device processing) in response to a write operation to the memory device 130 on the printer 20 side discussed above. The memory device processing in response to the write operation is the same as that during a read operation from S210 to S250 in FIG. 10. In the case of a write operation, in Step S240 of FIG. 10 the memory control circuit 136 of the memory device 130 receives a Write command. Consequently, the memory control circuit 136 having received the Write command executes the memory device write operation of Step S280 (FIG. 10).

FIG. 15 is a flowchart depicting the process steps of a write operation on the memory device. After an operation code is received, if the command data is a Write command, then in the same manner as in the read operation, the counter control module M16 controls the clock count value of the address counter M13 so as to specify Row A1 as the initial row targeted for writing. Then, based on the address specified by the count value of the address counter M13, the read/write control module M14 executes the write operation. Specifically, when the write operation is initiated, the data send/receive module M15 of the memory control circuit 136, in sync with rise of the clock signal CSCK, sequentially receives signals (1's or 0's) that appear on the data signal line LD1 following the command data, and sequentially stores these in the register. As a result, the data send/receive module M15 sequentially receives the 32-bit write data, i.e. the original data upper 8 bits UDn, inverted original data upper 8 bits /UDn, original data lower 8 bits LDn, and inverted original data lower 8 bits /LDn (FIG. 15: Steps S2802 to S2808). After completing Step S2808, the data send/receive module M15 changes the send/receive direction to the direction of sending from the memory device 130 to the sub-controller 50, and sends the sub-controller 50 a response signal (either an NG response signal or OK response signal, discussed later) from the memory device 130.

When one unit of the 32-bit write data is received, the data determination module M19 decides whether or not the exclusive OR of an m-th value of the original data Dn and an m-th value of the inverted mirror data /dn is true "1" for all values of m ($1 \leq m \leq 16$), i.e. whether or not it is FFFF (FIG. 15: Step S2810). The original data Dn referred to here is 16-bit data in which the original data upper 8 bits UDn received in the aforementioned Step S2802 constitute the upper bits, and the original data lower 8 bits LDn received in the aforementioned Step S2806 constitute the lower bits. The inverted data /Dn referred to here is 16-bit data in which the inverted original data upper 8 bits /UDn received in the aforementioned Step S2804 constitute the upper bits, and the inverted original data lower 8 bits /LDn received in the aforementioned Step S2808 constitute the lower bits.

If the output of the exclusive OR operation (determination outcome by the data determination module M19) is false "0" for any of the 16 bits, i.e. if it is not FFFF (FIG. 15: Step S2810: NO), the data send/receive module M15 sends an NG response signal (low level) to the communication process module 55 of the sub-controller 50 (FIG. 15: Step S2812). Since the data signal line LD1 is maintained at a low level by the pull-down resistor R1 of the sub-controller 50 when there is no data transmission on the line, it is permissible that the data send/receive module M15 does not send any signal to the communication process module 55 of the sub-controller 50, in place of sending an NG response signal. In this case, the communication process module 55 also recognizes the low level state of the data signal line LD1 as an NG response signal. Accordingly, this is substantially equivalent to the case where an NG response signal is actually returned. Once the NG response signal has been sent, the write operation on the memory device terminates (abnormal termination).

If on the other hand the output of the exclusive OR operation (determination outcome by the data determination module M19) is affirmative (true "1") for all 16 bits, i.e. if it is FFFF (FIG. 15: Step S2810: YES), the data determination module M19 performs a parity check of the received 16-bit original data Dn and determine the consistency of the data (FIG. 15: Step S2813). If the result of the parity check is that the data lacks consistency (FIG. 15: Step S2813: NO), the data send/receive module M15 sends an NG response signal (low level) to the communication process module 55 of the sub-controller 50 (FIG. 15: Step S2812). Since the data signal line LD1 is maintained at a low level by the pull-down resistor R1 of the sub-controller 50 when there is no data transmission on the line, it is permissible that the data send/receive module M15 does not send any signal to the communication process module 55 of the sub-controller 50, thereby substantially sending an NG response signal. Once the NG response signal is sent, the write operation on the memory device terminates (abnormal termination). If on the other hand the result of the parity check is that the data has consistency (FIG. 15: Step S2813: YES), the data send/receive module M15 sends an OK response signal (high level) via the data terminal to the communication process module 55 of the sub-controller 50 (FIG. 15: Step S2814).

The response signal (either an NG response signal or an OK response signal) is transmitted in sync with the next rise of the clock signal CSCK following reception of a unit of the 32-bit write data (FIG. 14). Specifically, after the memory device 130 has received a unit of the 32-bit write data in sync with a clock signal sent from the sub-controller 50, the memory device 130 sends a response signal to the sub-controller 50 in sync with the next clock signal sent from the sub-controller 50. In the event that the ID comparator module M11 or the command parse module M12 determines that the ID data or the command data CM includes a communication error, and the memory control circuit 136 terminates operation without any meaningful process accordingly, the memory device 130 does not transmit any data during the response signal transmission period. As described previously, the data signal line LD1 is maintained at a low level by the resistor R1 of the sub-controller 50 when there is no data transmission between the sub-controller 50 and the memory device 130. When the communication process module 55 detects a low level on the data signal line LD1 during the response signal transmission period, the communication process module 55 decides that an NG signal is transmitted and a communication error is occurred. In other words, the transmission of NG signal in Step S2812 is performed when some inconsistency is detected in the identification data or in the command data.

If an OK response signal is sent, the copy data generation module M17 of the memory control circuit 136 generates mirror data dn which is a copy of the received 16-bit original data (FIG. 15: Step S2816). Specifically, in addition to the register for receiving original data Dn, the memory control circuit 136 is provided with a 16-bit register for storing mirror data dn, and the copy data generation module M17 copies the original data Dn to generate the mirror data dn.

Next, the read/write control module M14 reads the previously stored data from the memory area targeted for writing (write-targeted memory area) of the original data Dn and the mirror data dn, whereupon the data determination module M19 performs a parity check of the read out previously stored data (FIG. 15: Step S2818). The write-targeted memory area for a single batch write operation is equal to a single row on the memory map in FIG. 7. As shown in FIG. 7, the upper 16 bits of the write-targeted memory area (an area equivalent to one row) constitute an original data area for writing original data Dn, while parity data P is stored on the last bit of the original data area. The lower 16 bits of the write-targeted memory area (an area equivalent to one row) constitute a mirror data area for writing mirror data dn, while as in the original data area, parity data P is stored on the last bit of the mirror data area. In Step S2818, a parity check is performed respectively for the previously stored data that has been stored in the original data area of the write-targeted memory area, together with the previously stored data that has been stored in the mirror data area.

Once the parity check is finished, the read/write control module M14 carries out writing of data to the write-targeted memory area (FIG. 15: Step S2820). Here, if no parity error is detected in either the previously stored data of the original data area or the previously stored data of the mirror data area of the write-targeted memory area, the read/write control module M14 writes the original data that was received in Steps S2802, S2806 to the original data area, and write the mirror data that was generated in Step S2816 to the mirror data area, respectively. If on the other hand a parity error is detected in the previously stored data of the original data area of the write-targeted memory area, but no parity error is detected in the previously stored data of the mirror data area of the write-targeted memory area, the read/write control module M14 writes the previously stored data, rather than the received original data Dn, to the original data area, and writes the mirror data that is generated in Step S2816 to the mirror data area, respectively. If no parity error is detected in the previously stored data of the original data area of the write-targeted memory area, but a parity error is detected in the previously stored data of the mirror data area of the write-targeted memory area, the read/write control module M14 writes the original data that was received in Steps S2802, S2806 to the original data area, and writes the previously stored data to the mirror data area, respectively. If a parity error is detected in both the previously stored data of the original data area and the previously stored data of the mirror data area of the write-targeted memory area, the read/write control module M14 rewrites the previously stored data to both the original data area and the mirror data area. That is, for a memory area in which a parity error is encountered, the read/write control module M14 performs a rewrite of the previously stored data, and for a memory area in which no parity error is encountered, it will perform an update of the data.

When performing writing of data to a write-targeted memory area, the command parse module M12 of the memory control circuit 136 decides whether all of the data for writing has been received (FIG. 15: Step S2822). The command parse module M12 may decide that all of the data for writing has been received when it receives EOF data. Alternatively, it may decide that all of the data for writing has been received when it detects that the reset signal CRST has transitioned from high level to low level. If all of the data for writing has been received (FIG. 15: Step S2822: YES), the memory control circuit 136 terminates the write operation. If not all of the data for writing has been received, the memory control circuit 136 returns to Step S2802 and repeat the process described above for the next unit of write data. For example, once the first unit of write data D1 and /D1 is received and the above process is carried out, next, the second unit of write data D2 and /D2 is received and the above process is carried out. In the present embodiment, because the address counter M13 specifies word addresses sequentially, following Row A1 write operations takes place in order of Row A2, Row A3 . . . . Also, after transmission of an OK response signal (Step S2814), in order to receive the next unit of write data, the data send/receive module M15 sets the send/receive direction for data exchanged via the data terminal to the direction in which the memory device 130 receives data from the sub-controller 50. The steps of the flowchart depicted in FIG. 15 may be executed in a different order or in parallel, provided that no conflicts are created. For example, the memory control circuit 136 may generate mirror data prior to sending an OK signal; or it may generate the mirror data while carrying out the parity check of previously stored data in a parallel operation.

As described above, during a write operation (FIG. 14), identification data ID, inverted identification data /ID, write command data CM, inverted write command data /CM, and a set of write data D1 and inverted write data /D1 of a prescribed size are transmitted in this order from the communication process module 55 to the memory device 130; after which the second and subsequent sets of write data Dn and inverted write data /Dn are transmitted repeatedly, one set at a time. In the example of FIG. 14, the data size of one set of write data Dn and inverted write data /Dn is 32 bits; however, some other data size may be established instead. From the time that reception of identification data ID starts until reception of the first set of write data D1 and inverted write data /D1 is finished, the memory control circuit 136 of the memory device 130 does not send any OK or NG response signals indicative of a consistency determination result for the received data to the communication process module 55, but rather sends an OK or NG response signal indicative of the consistency determination result to the communication process module 55 only after reception of the first set of write data D1 and inverted write data /D1 is finished. Likewise, with regard to the second and subsequent sets of write data Dn and inverted write data /Dn, an OK or NG response signal indicative of the determination result for each set is sent from the memory control circuit 136 to the communication process module 55 each time that reception of the set is completed. In this way, each time that one set of write data Dn and inverted write data /Dn of prescribed size is received, an OK or NG response signal indicative of the consistency determination result for the set is sent to the communication process module 55, so the reliability of communications between the communication process module 55 and the memory device 130 is enhanced.

In the initial phase of a write operation, from the time that reception of identification data ID starts until reception of the first set of write data D1 and inverted write data /D1 is finished, no data consistency determination results are sent to the communication process module 55, and thus the number of times that determination results are sent from the memory device 130 to the communication process module 55 is reduced, and the write operation as a whole is carried out efficiently. Moreover, in write operations, consistency of the identification data ID and inverted identification data /ID, and consistency of the write command data CM and the inverted write command data /CM, are determined as in read operations (see Steps S220 to S245 of FIG. 10). If the identification data ID and/or write command data CM lack consistency, the memory control circuit 136 terminates the process without carrying out writing of the received data to the memory cell array 132. In this case, during the initial response signal transmission period (the period following transmission of the data UD1, /UD1, LD1, /LD1), no OK response signal is sent from the memory device 130 to the communication process module 55 and an NG response signal is sent to the communication process module 55, so the communication process module 55 recognizes that some sort of error is occurred. While the data transmission direction does change around the time that the response signal (OK/NG response signal) is sent, in preferred practice changes in data transmission direction should be as infrequent as possible because of the possibility that a bus collision occurs. In the present embodiment, through an arrangement whereby in the initial phase of a write operation, no data consistency determination results are sent to the communication process module 55 from the time that reception of identification data ID starts until reception of the first set of write data D1 and inverted write data /D1 is finished, the frequency of change in data transmission direction is minimized, and the reliability and speed of communication is enhanced.

Additionally, as depicted in FIG. 15 affirmative consistency determination results are generated only when the write data Dn and the inverted write data /Dn have a mutually inverted relationship and no parity errors are detected in the respective sets of data. By carrying out consistency determination in this way it is possible to further enhance the reliability of communications. That is, assume that one bit of the write data Dn and one bit of the inverted write data /Dn each contain an error at the same bit location, so that the determination result indicates that write data Dn and the inverted write data /Dn have consistency. Nevertheless, in such an instance, because the errors are identified in the respective parity checks, it is possible to prevent the erroneous data from being written.

As will be appreciated from the discussion above, in the present embodiment, the original data Dn corresponds to the first data in the appended claims, and the inverted data /Dn corresponds to the second data in the present invention. The mirror data do corresponds to the third data in the present invention, and the inverted mirror data /dn corresponds to the fourth data in the present inventions. Transmission of response signals (OK response signals and NG response signals) corresponds to the element of transmitting the determination result in the present invention.

Figure 16:
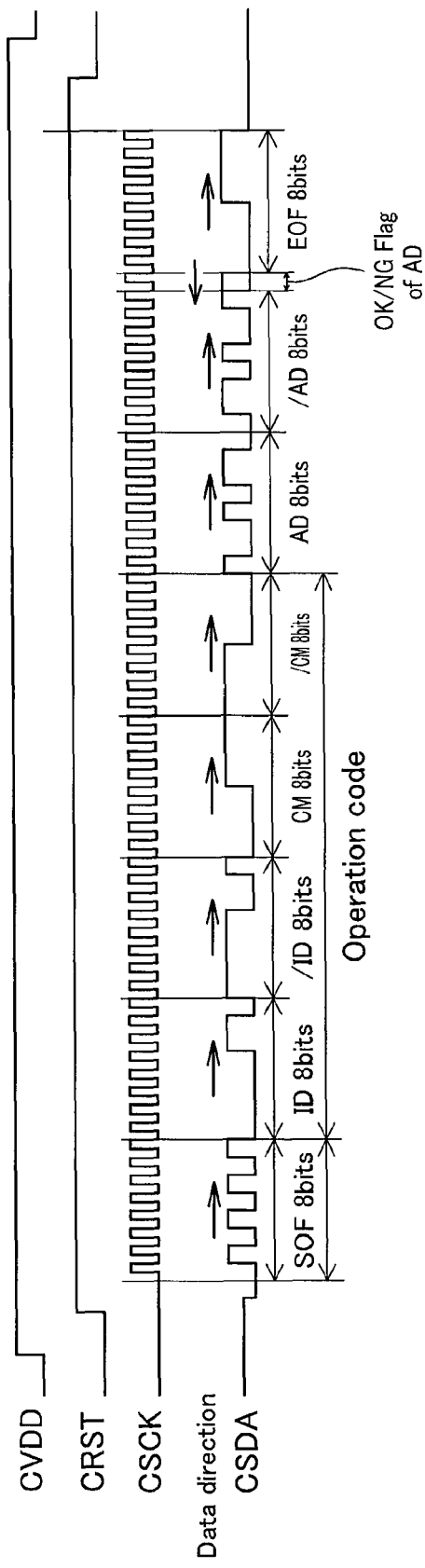
FIG. 16 is a timing chart schematically depicting signals exchanged between a communication process module and a memory control circuit during a write lock operation of a memory device.

Memory Device Write Lock Operation:

FIG. 16 is a timing chart schematically depicting signals exchanged between the communication process module 55 of the printer 20 and the memory control circuit 136 of the memory device 130 during a write lock operation of the memory device. The write lock operation is a process whereby some portion of the rewriteable memory area in the memory map (FIG. 7) of the ferroelectric memory array 132 is changed to a write lock area, in row units. A row changed to a write lock area can no longer be overwritten through access from an external device (e.g. the communication process module 55 of the sub-controller 50).

As in the read operation and write operation discussed above, the communication process module 55 first sends SOF data as a data signal CSDA (FIG. 16). As in the read operation and write operation discussed above, following the SOF data, the communication process module 55 sends identification data in as a data signal CSDA (FIG. 16). Following the identification data, the communication process module 55 sends command data as a data signal CSDA (FIG. 16). The command data sent in this process is a Write Lock command representing a write lock operation. In sync with the next rise of the clock signal CSCK following completion of transmission of the command data, the communication process module 55 sends write lock-targeted address data AD and inverted write lock-targeted address data /AD in such a way that the memory control circuit 136 of the memory device 130 receives the data one bit at a time in synchronization with the clock signal (FIG. 16). The write lock-targeted address data AD is composed of 8-bit data for example, and identifies a row to be changed from a write-enable area to a write lock area. The inverted write lock-targeted address data /AD is 8-bit data obtained by inverting the value of each bit of the write lock-targeted address data AD.

In sync with the next rise of the clock signal CSCK following completion of transmission of the write lock-targeted address data AD and inverted write lock-targeted address data /AD, the communication process module 55 receives a 1-bit response signal (either a "1" or a "0") from the memory device 130 (FIG. 16). As in write operations, a high level response signal (OK response signal) is a signal indicating that the write lock-targeted address data AD and inverted write lock-targeted address data /AD are received correctly at the memory device 130, while a low level response signal (NG response signal) is a signal indicating that the write lock-targeted address data AD and inverted write lock-targeted address data /AD are not received correctly at the memory device 130.

If the received response signal is an NG response signal, the communication process module 55 carries out a prescribed error process and terminate the write lock operation. The error process is a process identical to the error process that takes place when an NG response signal is received in the write operation described above, for example. On the other hand, if the received response signal is an OK response signal, the communication process module 55 sends EOF (End of Frame) data to the memory device 130 and terminate the process (FIG. 16).

The discussion now turns to processing that takes place on the memory device 130 (memory device processing) in response to the write lock operation to the memory device 130 at the printer 20 discussed above. The memory device processing in response to the write lock operation is described in FIG. 10. In the case of the write lock operation, in Step S240 of FIG. 10 the memory control circuit 136 of the memory device 130 receives a Write Lock command. Consequently, the memory control circuit 136 having received the Write Lock command executes a write lock operation of Step S270 (FIG. 10).

When the write lock operation starts, the read/write control module M14 of the memory control circuit 136, in sync with rise of the clock signal CSCK, sequentially receives signals (1's or 0's) that appear on the data signal line LD1 following the command data, and sequentially stores these in the register. As a result, the memory control circuit 136 sequentially receives the write lock-targeted address data AD and inverted write lock-targeted address data /AD.

The data determination module M19 decides whether or not the output of an exclusive OR operation for the received write lock-targeted address data AD and inverted write lock-targeted address data /AD is true for all 8 bits of these data, i.e. whether or not it is 11111111 (FF). If it is found that the output of the exclusive OR operation is not FF, the data send/receive module M15 sends an NG response signal (low level) to the communication process module 55 of the sub-controller 50. Once the NG response signal is sent, the write lock operation on the memory device terminates (abnormal termination).

If on the other hand the output of the exclusive OR operation is true "1" for all 8 bits, i.e. if it is FF, the read/write control module M14 changes the row of the rewriteable area identified by the write lock-targeted address data AD of the control area to a write lock area. Specifically, after receiving the operation code, if the type of access is write lock, the counter control module M16 sets the counter value of the address counter M13 so as to select the lead row of the control area. The count then advances to select a row that includes a cell storing a flag for the write lock-targeted address data AD in the control area. After the row that includes a cell storing a flag for the write lock-targeted address data AD is selected by the address counter M13 as the row targeted for the write operation, the read/write control module M14 updates the row so that the flag information of the cell corresponding to the write lock-targeted address data AD changes from "0" to "1". The read/write control module M14 updates the cell of the control area storing the flag for the row of the rewriteable area identified by the write lock-targeted address data AD, thereby changing the row of the rewriteable area identified by the write lock-targeted address data AD to a write lock area, and terminate the write lock operation. Specifically, the read/write control module M14 changes the write lock flag information corresponding to the row identified by the write lock-targeted address data AD from "0" to "1".

Figure 17:
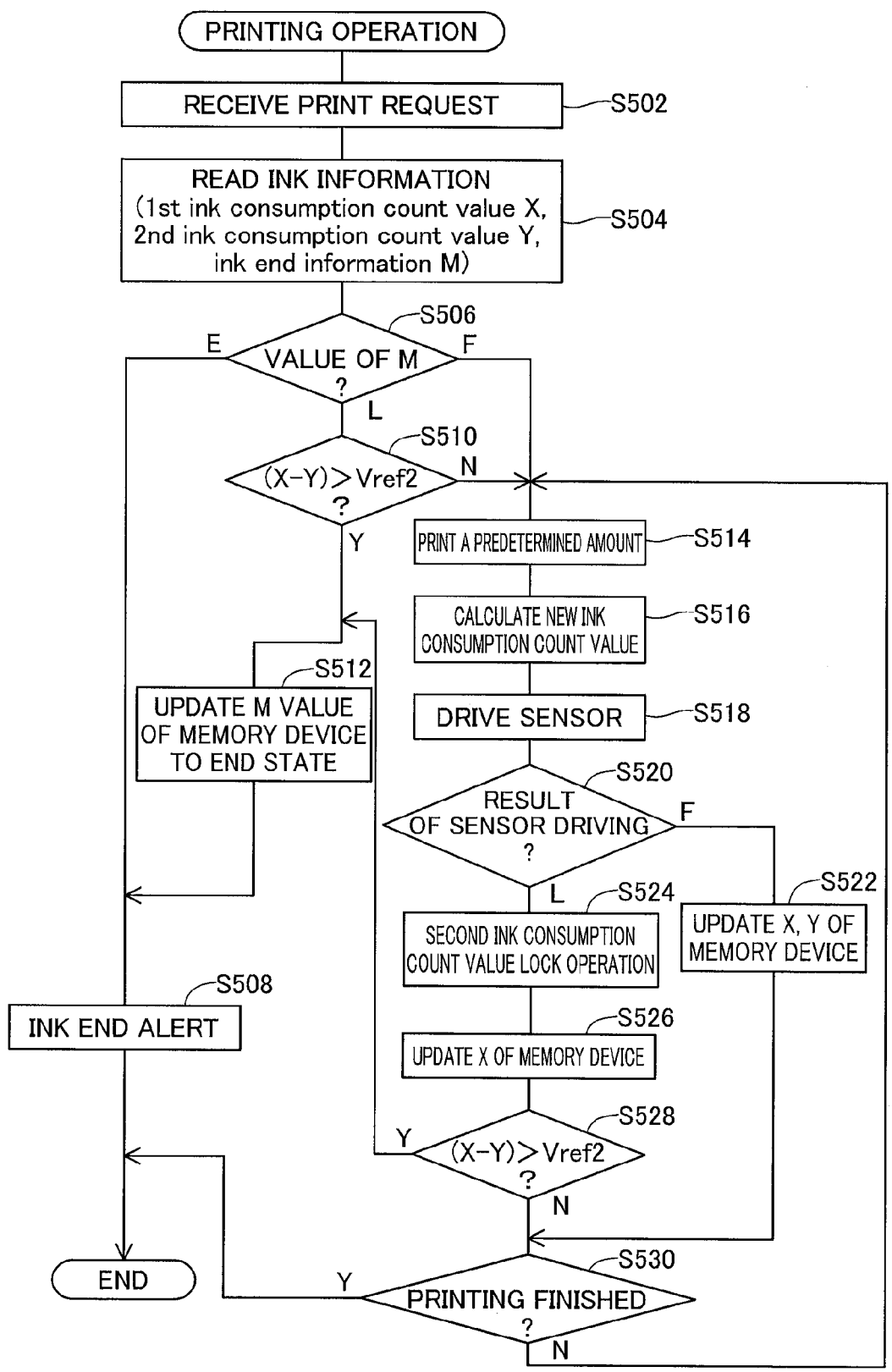
FIG. 17 is a flowchart depicting the process steps in a printing operation.

Printer Printing Operation:

In light of the processes relating to the memory devices 130 discussed above, the discussion now turns to the printing operation in the printer 20. FIG. 17 is a flowchart depicting the process steps in a printing operation that is executed primarily by the main controller 40. For convenience in description, the following discussion of the printing operation focuses upon a single ink cartridge 100, but in actual practice the same processes are carried out for each ink cartridge 100 installed in the printer 20.

The printing operation is initiated when the main controller 40 receives a print request from the user via the computer 90 or the console portion 70 (FIG. 17: Step S502). When a print request is received, the main controller 40 executes the read operation from the memory device 130 discussed earlier, and read out ink information from the memory device 130 of the ink cartridge 100 (FIG. 17: Step S504). The read out ink information includes at least the first ink consumption count value X, the second ink consumption count value Y, and ink end information M.

When the main controller 40 reads out the ink information, it decides whether the value of the ink end information M indicates either the full state, the low state, or the end state mentioned previously (FIG. 17: Step S506). If the main controller 40 decides that the ink end information M indicates the end state (FIG. 17: Step S506: E), it carries out an ink end alert directed to the user (FIG. 17: Step S508). The ink end alert may involve, for example, displaying on the display panel of the console portion 70 a message prompting the user to replace the ink cartridge 100.

If the main controller 40 decides that the ink end information M indicates the low state (FIG. 17: Step S506: L), it decides whether the value of the difference (X−Y) between the first ink consumption count value X and the second ink consumption count value Y is equal to or greater than a second threshold value Vref2 (FIG. 17: Step S510). As will be discussed later, the row storing the second ink consumption count value Y in the memory device 130 is write locked at the point that ink end was detected, so the second ink consumption count value Y will not be updated. If the value of (X−Y) is equal to or greater than the second threshold value Vref2 (FIG. 17: Step S510: YES), the main controller 40 updates the value of the ink end information M of the memory device 130 to the end state (FIG. 17: Step S512). Specifically, the main controller 40 executes the write operation to the memory device 130 discussed previously, and update the value of the ink end information M to "11". After updating the value of the ink end information M, the main controller 40 carries out the ink end notification described above (FIG. 17: Step S508).

On the other hand, if the main controller 40 decides that the ink end information M indicates the full state (FIG. 17: Step S506: F) or that the value of (X−Y) is less than the second threshold value Vref2 (FIG. 17: Step S510: NO), it carries out a predetermined amount of printing of the print job requested by the print request (FIG. 17: Step S514).

Once the predetermined amount of printing is carried out, the main controller 40 calculates a new ink consumption count value (FIG. 17: Step S516). Specifically, on the basis of the particulars of execution of the predetermined amount of printing, the main controller 40 estimates the amount of ink consumed in the course of the predetermined amount of printing. The main controller 40 then adds a count value, equivalent to the estimated amount of ink consumed, to the first ink consumption count value X that was read out from the memory device 130 in Step S504, to arrive at a new ink consumption count value.

Once the new ink consumption count value is calculated, the main controller 40 drives the sensor 110 (FIG. 17: Step S518). On the basis of the result of driving the sensor 110, the main controller 40 decides whether the remaining ink level in the ink cartridge 100 is equal to or greater than the first threshold value Vref1 (i.e. full) or less than the first threshold value Vref1 (i.e. low) (FIG. 17: Step S520).

If the remaining ink level in the ink cartridge 100 is determined to be equal to or greater than the first threshold value Vref1 (FIG. 17: Step S520: F), the main controller 40 will update the first ink consumption count value X and the second ink consumption count value Y that are saved to the memory device 130, to the new ink consumption count value that was calculated in Step S516 (FIG. 17: Step S522). Specifically, the main controller 40 executes the write operation discussed earlier, accessing the memory device 130 and overwriting the first ink consumption count value X and the second ink consumption count value Y with the new ink consumption count value. As a result, the first ink consumption count value X and the second ink consumption count value Y will be the same.

On the other hand, if the remaining ink level in the ink cartridge 100 is determined to be less than the first threshold value Vref1 (FIG. 17: Step S520: L), the main controller 40 verifies whether the memory area storing the second ink consumption count value Y (FIG. 7: Row A2 of the memory map) is a write lock area (i.e. with reference to the write lock flag stored in a memory area of the SRAM 551 which corresponds to the control area of the memory device 130); and in the event it is found not to be a write lock area, carries out a second ink consumption count value lock operation to place a write lock on the row storing the second ink consumption count value Y (FIG. 17: Step S524). The second ink consumption count value lock operation is carried out using the write lock operation for the memory device 130 discussed earlier. Once the second ink consumption count value lock operation is carried out, the value of the second ink consumption count value Y in the memory device 130 is no longer modifiable. Consequently, the value of the second ink consumption count value Y in the memory device 130 will be held at the ink consumption count value that obtained just prior to the time that the remaining ink level was first detected to be lower than the first threshold value Vref1, through driving of the sensor 110.

When the second ink consumption count value lock operation is completed, the main controller 40 executes the write operation discussed earlier on the first ink consumption count value X in the memory device 130, thereby updating it to the new ink consumption count value that was calculated in Step S516 (FIG. 17: Step S526). At this time, due to the write lock, the second ink consumption count value is not updated.

When the first ink consumption count value X is updated, the main controller 40 decides whether the value of the difference (X−Y) between the first ink consumption count value X and the second ink consumption count value Y is equal to or greater than a second threshold value Vref2 (FIG. 17: Step S528). Here, the first ink consumption count value X is the value that was updated in Step S526. Meanwhile, the second ink consumption count value Y is the newer of the value that was read out in Step S504 or the values that were updated in Step S522. If the difference (X−Y) is equal to or greater than the second threshold value Vref2 (FIG. 17: Step S528: YES), the main controller 40 updates the value of the ink end information M of the memory device 130 to the end state (Step S512), and carries out the ink end alert discussed above (FIG. 17: Step S508).

After the first ink consumption count value X and the second ink consumption count value Y are updated in Step S522, or if in Step S528 the value of (X−Y) is found to be less than the second threshold value Vref2 (FIG. 17: Step S528: NO), the main controller 40 decides whether the print job based on the print request is completed (FIG. 17: Step S530). If the print job is completed (FIG. 17: Step S530: YES), the printing operation terminates. If the print job is not completed, the system returns to Step S514, and a predetermined amount of printing is carried out again.

According to the present embodiment discussed above, during a write operation to the memory device 130, the memory device 130 verifies the consistency of the original data Dn that is to be written to the memory cell array 132 and the inverted data /Dn, and for each 16 bits of original data Dn transmits a response signal indicating if there is consistency. As a result, reliability of communication between the subcontroller 50 and the memory device 130 is enhanced. If the original data Dn and the inverted data /Dn lack consistency, the memory device 130 does not write the original data Dn to the ferroelectric memory array 132, so erroneous updating of the ferroelectric memory array 132 is avoided. Moreover, during write operations to the memory device 130, because the original data Dn and the inverted data /Dn have an inverted bit relationship to one another, if for example there is encountered a communication error such that only low level or high level appears on the data signal line LD1 owing to a contact fault between the data terminal 260 of the ink cartridge 100 and the corresponding terminal on the printer 20, the communication error is detected in a reliable manner. Moreover, because consistency (presence or lack of communication errors) of the original data Dn and the inverted data /Dn is determined through an exclusive OR operation carried out on each bit of the original data Dn and the inverted data /Dn, highly reliable detection of communication errors is accomplished easily.

Furthermore, according to the present embodiment, during a read operation from the memory device 130 original data Dn, together with inverted data /Dn which is equal in size to the original data Dn but with each bit inverted, are sent from the memory device 130 to the sub-controller 50. At the sub-controller 50, the presence or lack of communication errors is then determined by checking the consistency of the original data Dn and the inverted data /Dn. As a result, reliability of communication between the sub-controller 50 and the memory device 130 is enhanced. Consequently, problems such as erroneous operation of the printer 20 are kept to a minimum. Moreover, during read operations from the memory device 130, because the original data Dn and the inverted data /Dn have an inverted bit relationship to one another, if for example there is encountered a communication error such that only low level or high level appears on the data signal line LD1 owing to a contact fault between the data terminal 260 of the ink cartridge 100 and the corresponding terminal on the printer 20, the communication error is detected in a reliable manner. Further, during read operations from the memory device 130, because the memory device 130 sends the sub-controller 50 mirror data dn which is substantially identical to the original data Dn, and inverted mirror data /dn which is substantially identical to the inverted data /Dn, even if the original data Dn and the inverted data /Dn lack consistency owing to a communication error for example, as long as the mirror data dn and the inverted mirror data /dn have consistency, processing can continue on the printer 20 using either the mirror data dn or the inverted mirror data /dn, thus enhancing the robustness of the system with respect to communication errors. Further, in the memory device 130, mirror data dn is stored together with original data Dn in the ferroelectric memory array 132, and both are sent to the printer 20. As a result, even if a cell error is occurred in either the original data area or the mirror data area of the ferroelectric memory array 132, normal operation may continue on the printer 20, using the data stored in the area in which the cell error did not occur. Robustness of the system with respect to cell errors is enhanced thereby, thus dramatically reducing memory device 130 failure rates.

Further, when the printer 20 in the present embodiment receives original data Dn, inverted data /Dn, mirror data dn, and inverted mirror data /dn, it first performs a consistency check of the original data Dn and the inverted mirror data /dn; and if consistency is lacking, checks the consistency of the original data Dn and the inverted data /Dn, and the consistency of the mirror data dn and the inverted mirror data /dn. Then, if the original data Dn and the inverted mirror data /dn lack consistency, but the original data Dn and the inverted data /Dn have consistency and the mirror data dn and the inverted mirror data /dn have consistency, it determines that a cell error is occurred. If the original data Dn and the inverted mirror data /dn lack consistency, and moreover the original data Dn and the inverted data /Dn lack consistency or the mirror data dn and the inverted mirror data /dn lack consistency, it determines that a communication error is occurred. By so doing the printer 20 can correctly ascertain the type of the error, and perform appropriate processing according to the error type.

Further, in the present embodiment, in the memory map of the ferroelectric memory array 132 (FIG. 7), actual data and parity data are stored in the original data area, and actual data and parity data are stored in the mirror data area as well. During a read operation from the rewriteable area, the actual data (upper 15 bits) and the parity data (lower 1 bit) stored in the original data area are sent from the memory device 130 to the sub-controller 50, and the actual data (upper 15 bits) and the parity data (lower 1 bit) stored in the mirror data area are sent from the memory device 130 to the sub-controller 50. Consequently the printer 20 having received this data then performs a parity check of the actual data that was stored in the original data area, and perform a parity check of the actual data that was stored in the mirror data area. Even if a parity error is occurred either in the actual data that was stored in the original data area or in the actual data that was stored in the mirror data area, the main controller 40 is able to continue normal operation using the set of actual data in which no parity error is occurred. As a result, robustness of the system against communication errors and cell errors may be enhanced.

In write operations in the present embodiment, for previously stored data in a write-targeted area, the memory device 130 carries out a parity check of the 16 bits stored in the original data area and the 16 bits stored in the mirror data area, respectively. As a result, in an area in which a parity error is detected, the previously stored data is rewritten; whereas in an area in which no parity error is detected, new data is written. Because an area in which a parity error is detected can be assumed to have a problem with a memory cell, the parity check may also be recognized as a means for detecting memory area problem. As a result, data updating is not performed in an area in which a problem is occurred, so unanticipated difficulties that may result from updating data in an area that includes a problem may be avoided. Moreover, in a cell that is experiencing a cell error, by rewriting previously stored data to an area in which a parity error is detected, change in data due to a data retention fault may be avoided. A data retention fault refers to a fault whereby the saved data value in a memory cell changes due to gradual dissipation of charge. If owing to a data retention fault, data changes in an area in which a cell error is assumed to have occurred, parity consistency may happen by chance, posing a risk that the cell error is not correctly detected.

Further, in the printer 20 according to the present embodiment, if through driving of the sensor 110 it is determined that the remaining ink level of the ink cartridge 100 is less than the first threshold value Vref1, a prohibit request (write lock operation) is carried out for the memory area of the memory device 130 storing the second ink consumption count value Y, so that the second ink consumption count value Y will not be updated. As a result, after the prohibit request is issued, the memory device 130 no longer accepts requests to update the second ink consumption count value Y. As a result, the second ink consumption count value Y is maintained at the ink consumption count value that obtained just prior to the time that the sensor detected that the remaining ink level was lower than the first threshold value Vref1. The second ink consumption count value Y is thus prevented from being updated in error. Further, because the first ink consumption count value X continues to be updated even after updating of the second ink consumption count value Y is suspended, the ink consumption level is accurately recognized from the value of (X−Y) even after the sensor 110 detects that the remaining ink level is lower than the first threshold value Vref1. As a result, an ink end point is determined with good accuracy, making it possible for the ink contained in the ink cartridge 100 to be used to the end without any waste. As will be appreciated from the discussion above, in the present embodiment, the inverted data generation module M18 corresponds to the data generation section in the present invention.

B. Modified Embodiments

Modified Embodiment 1

In the preceding embodiment, inverted data /Dn is used as an example of "the data generated on the basis of the original data Dn", but no limitation thereto is implied. For example, a value obtained through addition of a given value to the original data Dn, a value obtained through subtraction of a given value, a value obtained through multiplication by a given value, or the like may also be used as data for checking consistency with the original data Dn. Generally, it suffices for the original data Dn and the data generated from the original data Dn to have a prescribed correlation such that the presence or lack of this prescribed correlation between the original data Dn and the data generated from the original data Dn can be determined. In preferred practice, the original data Dn and the data generated from the original data Dn have identical data size.

Modified Embodiment 2

In the write operation of the preceding embodiment, 32 bit data composed of original data upper 8 bits UDn, inverted mirror data upper 8 bits /Udn, original data lower 8 bits LDn, and inverted mirror data lower 8 bits /Ldn are transmitted in that order from the sub-controller 50 to the memory device 130; however, the order of transmission may be modified as desired, and it is acceptable to first transmit 16 bits of original data Dn1, followed by transmission of 16 bits of inverted data /Dn. Also, the inverted data may be sent first, and the original data sent afterwards.

Modified Embodiment 3

In the write operation of the preceding embodiment, 32 bits of original data and inverted data are employed as a single unit of data, and each time that transmission of one unit of data from the sub-controller 50 to the memory device is finished, a response signal is returned from the memory device to the sub-controller 50; however, the data length of the unit of data is may be modified as desired, and a single data unit may include 64 bits of original data and inverted data, or a single data unit may include 16 bits of original data and inverted data.

Modified Embodiment 4

In the preceding embodiment, the sub-controller 50 of the printer 20 is used as the host circuit; however, any circuit, such as a computor, may be used as the host circuit. In the preceding embodiment, the memory device 130 of an ink cartridge 100 is used as the memory device, but any nonvolatile memory device may be used. In this case, the invention may be implemented effectively in an arrangement whereby the host circuit and the memory device are electrically connected via circuit terminals that are electrically connected to the host circuit, and memory device terminals that are electrically connected to the memory device and that are detachably attachable to the circuit terminals. By so doing, communication errors arising from faulty contact between memory device terminals and circuit terminals may be detected, and the reliability of communication between the host circuit and the memory device may be enhanced.

Modified Embodiment 5

In the preceding embodiment, the ferroelectric memory array 132 is provided with both an original data area and a mirror data area; however, only an original data would suffice. In this case, the memory control circuit 136 may be provided with a read copy data generation section adapted to copy data stored in the original data area to generate mirror data dn (copy data), and with an inverted data generation section adapted to invert each bit of the data stored in the original data area to generate inverted data /Dn and inverted mirror data /dn. Then, during the read operation at the memory device 130, the data send/receive module M15 of the memory control circuit 136 sends the data that is stored in the original data area as original data Dn to the sub-controller 50; and sends the sub-controller 50 the mirror data dn, the inverted data /Dn, and the inverted mirror data /dn which are generated from the original data Dn. The data send/receive module M15, after storing the data read out from the original data area in a register, may send it as original data, and then send other data stored in the register as mirror data. In the fifth modified embodiment, the copy data generation module and the inverted data generation module correspond to the data generation section in the present invention.

Modified Embodiment 6

In the preceding embodiment, the ferroelectric memory array 132 has an original data area and a mirror data area; however, the ferroelectric memory array 132 may instead have an original data area and an inverted data area. In this case, the read/write control module M14 writes the original data Dn in the original data area, and writes the inverted data /Dn in the inverted data area. During read operations, the data send/receive module M15 of the memory control circuit 136 sends to the sub-controller 50 as original data Dn the data stored in the original data area, and as inverted data /Dn the data stored in the inverted data area; and sends to the sub-controller 50 as mirror data dn the data which is read from this same original data area, and as inverted mirror data /dn the data which is read from this same inverted data area. In this case as well, the host circuit is able to detect communication errors through exclusive OR operations. It is possible to detect the occurrence of memory cell errors by carrying out a parity check.

Modified Embodiment 7

In the preceding embodiment, the ferroelectric memory array 132 has an original data area and a mirror data area; however, the ferroelectric memory array 132 may instead have an original data area for storing original data Dn, and inverted data area for storing inverted data /Dn of the original data Dn, a mirror data area for storing mirror data dn of the original data Dn, and an inverted mirror data area for storing inverted mirror data /dn which is inverted data of the mirror data dn. In this case, the read/write control module M14 and the data send/receive module M15 of the memory control circuit 136 read out the stored data as-is and transmit it.

Modified Embodiment 8

In the read operation in the preceding embodiment, original data Dn, inverted data /Dn, mirror data dn, and inverted mirror data /dn are transmitted from the memory device 130 to the sub-controller 50; however, it would suffice to transmit original data Dn and inverted data /Dn only, omitting transmission of mirror data dn and inverted mirror data /dn. Alternatively, it would suffice to transmit original data Dn and mirror data dn only, omitting transmission of inverted data /Dn and inverted mirror data /dn.

Modified Embodiment 9

In the write operation in the preceding embodiment, both actual data and parity data for storage in the memory map of the ferroelectric memory array 132 are generated on the printer 20 and transmitted to the memory device 130. As an alternative, it is permissible that the printer 20 generates only the actual data and transmits it to the memory device 130, while the parity data is generated on the memory device 130. In this case, the memory control circuit 136 may be provided with a parity acquisition module for generating 1-bit parity data matching the 15 bits of actual data sent from the printer 20.

Modified Embodiment 10

In the write operation in the preceding embodiment, the memory device 130 performs rewriting of the previously stored data to areas in which parity errors are detected, but a possible alternative would be to not write data to areas in which parity errors are detected.

Modified Embodiment 11

In the preceding embodiment, the ferroelectric memory array 132 of the memory device 130 stores a first ink consumption count value X and a second ink consumption count value Y that represent the amount of ink consumption; however, remaining level information representing the remaining ink level may also be stored. In this case, the initial value of the remaining level information represents the amount of ink filling the ink cartridge 100. During printing operations, the printer 20 overwrites the remaining level information stored in the ferroelectric memory array 132 with remaining level information in the direction of decreasing the remaining level, according to the amount of ink consumed in printing. In this case, it is preferable for the memory area storing the remaining level information to be established in a decrement area. A decrement area refers to an area that only allows numerical values to be overwritten in the decreasing direction, and does not allow numerical values to be overwritten in the increasing direction. Like the increment area in the embodiment, such a decrement area is preferably established by writing decrement flag information to the read-only area.

Modified Embodiment 12

In the preceding embodiment, the second ink consumption count value Y and the first ink consumption count value X are respectively stored in the ferroelectric memory array 132, and ink end is determined on the basis of the difference between the first ink consumption count value X and the second ink consumption count value Y. Alternatively, only the second ink consumption count value Y may be stored in the ferroelectric memory array 132. In this case, processes would take place in the same manner as the embodiment, but with the first ink consumption count value X stored in nonvolatile memory provided on the printer 20.

Modified Embodiment 13

While the preceding embodiment employs a printer and ink cartridges of ink-jet format, it would also be acceptable to employ a liquid jetting apparatus adapted to jet or eject a liquid other than ink, and liquid receptacles for supplying the liquid to the liquid jetting apparatus. Herein, the term liquid is used to include a liquid state body containing particles of a functional material dispersed in a medium; or a gel or similar fluid state body. For example, there may be employed a liquid jetting apparatus adapted to jet a liquid containing an electrode material, coloring matter, or other matter in dispersed or dissolved form, that is used in the manufacture of liquid crystal displays, EL (electroluminescence) displays, field emission displays, or color filters; a liquid jetting apparatus adapted to jet bioorganic substances used in biochip manufacture; or a liquid jetting apparatus adapted to jet a liquid as a specimen used as a precision pipette. Additional examples are a liquid jetting apparatus for pinpoint jetting of a lubricant into a precision instrument such as a clock or camera; a liquid jetting apparatus adapted to jet a solution of an ultraviolet-curing resin or other transparent resin onto a substrate for the purpose of forming a micro semi-spherical lens (optical lens) for use in an optical communication component etc.; or a liquid jetting apparatus adapted to jet an acid or alkali etchant solution for etching a circuit board, etc.; as well as liquid receptacles adapted to supply liquid to these kinds of liquid jetting apparatus. The present invention may be implemented in any one of the above types of jetting devices and liquid receptacles. No limitation to printers of ink-jet format is imposed, and a laser printer and toner cartridge for printing with printing material such as toner may also be employed.

Modified Embodiment 14

Some of the arrangements that are implemented through hardware in the preceding embodiment may instead be implemented through software, and conversely some of the arrangements that are implemented through software may instead be implemented through hardware.

Modified Embodiment 15

In the preceding embodiment, a sensor 110 that uses a piezoelectric element is employed, but it would be possible for example to instead employ an oscillator device such as an oscillator circuit designed to constantly return a response signal whose frequency indicates that ink is present; or to employ a processor such as a CPU or ASIC, or a simpler IC, to carry out exchanges with the sub-controller 50. The present invention may also be implemented in an ink cartridge 100 of a type lacking a sensor, and having only a memory device.

Modified Embodiment 16

In the preceding embodiment, a single ink tank constitutes a single ink cartridge, but instead a plurality of ink tanks may constitute a single ink cartridge.

Modified Embodiment 17

In the preceding embodiment, the liquid supply unit is an ink cartridge to whose receptacle body the board is secured, and the board thusly unified with the receptacle body is installed in the holder provided to the print head unit; however, the liquid supply unit embodying the present invention may instead be an ink cartridge of a design in which a cover to which the board is secured, and a receptacle body containing the liquid, are installed separately in the holder. In one exemplary arrangement, after the cover having the board secured thereto is inserted and installed in the holder in a prescribed insertion direction, the receptacle body is then installed in the holder. In this case, there may be employed in arrangement whereby only the ink receptacle body is replaced when the ink inside the receptacle body is depleted, and the ink consumption information (the first second ink consumption count value X and the second ink consumption count value Y) saved in the memory device 130 is reset in association with replacement.

Modified Embodiment 18

In the preceding embodiment, the liquid supply unit is installed in the holder of the print head unit and supplies ink directly to the print head from the ink supply portion; however in another possible arrangement, the liquid supply unit may be installed at a location inside the liquid jetting apparatus situated away from the head, and ink may be supplied to the head through a tube connecting the liquid supply unit to the ink supply portion.

Modified Embodiment 19

In the preceding embodiment, the memory device 130 is described as being a semiconductor memory device furnished with a ferroelectric memory cell array 132, but is not limited thereto and may instead be a semiconductor memory device that does not use ferroelectric memory cells (e.g. EEPROM or flash memory). Memory devices other than semiconductor memory devices may also be used.

Modified Embodiment 20

In the preceding embodiment, the main controller 40 and the communication process module 55 are separate arrangements, but they may instead be implemented as an integrated controller.

Modified Embodiment 21

In the preceding embodiment, in the course of communications between the memory device 130 and sub-controller 50, the memory device 130 is presented with a reset signal CRST from the sub-controller 50; however, the element of supplying a reset signal CRST may be omitted. In this case, the reset terminal 240 of the memory device 130, the terminal 440 on the printer 20 corresponding to the reset terminal 240, and the reset signal line LR1 would be dispensed with. In this case, initialization of the memory device 130 may take place autonomously when the memory device 130 is supplied with power supply voltage CVDD and starts up for example. Having initialized at startup, the memory device 130 may subsequently operate in response to the clock signal CSCK and data signals CSDA received from the sub-controller 50, in the same way as in the embodiment.

Modified Embodiment 22

In the preceding embodiment, the memory control circuit 136 of the memory device 130 includes the ID comparator module M11, the command parse module M12, and the data determination module M19. However, the ID comparator module M11, the command parse module M12, and the data determination module M19 may be implemented as respective separate hardware circuits. Alternatively, a part of or the entirety of these modules may be implemented as common hardware circuitry.

While the present invention is shown herein in terms of a preferred embodiment and modified embodiments thereof, the present invention is not limited to the embodiment and modified embodiments herein, and may be embodied in various other forms without departing from the spirit thereof.

What is claimed is:

1. A memory device electrically connectable to a host circuit, comprising:
    a nonvolatile data memory section;
    a read/write control section that reads a first data from the nonvolatile data memory section, the first data having a prescribed data amount; and
    a data transmission section that transmits to the host circuit the first data together with second data, wherein the second data is different from the first data and has prescribed correlation with content of the first data, the second data having an identical data amount to the data amount of the first data.

2. The memory device according to claim 1, further comprising:
    a data generation section that generates the second data using the first data.

3. The memory device according to claim 1, wherein the first data and the second data each are binary signals of n bits where n is an integer equal to or greater than 1, and the second data is inverted data that inverts each bit of the first data.

4. The memory device according to claim 3, wherein the integer n is an even number, and
    the data transmission section transmits, in synchronism with a clock signal, an upper n/2 bits of the first data, an upper n/2 bits of the second data, a lower n/2 bits of the first data, and a lower n/2 bits of the second data, in that order.

5. The memory device according to claim 1, wherein the data transmission section additionally transmits to the host circuit third data that is substantially identical to the first data, and fourth data that is substantially identical to the second data.

6. The memory device according to claim 5, wherein the nonvolatile data memory section has a first memory area for storing the first data, and a second memory area for storing the third data.

7. The memory device according to claim 5, further comprising
    a data generation section that generate the second data from the first data, and to generate the fourth data from the third data.

8. The memory device according to claim 5, wherein the first data, the second data, the third data, and the fourth data each are binary signals of m bits where m is an integer equal to or greater than 1;
    the third data is copy data copied from the first data,
    the second data is inverted data that inverts each bit of the first data,
    and the fourth data is inverted data that inverts each bit of the third data.

9. The memory device according to claim 8, wherein the integer m is an even number, and
    the data transmission section transmits, in synchronism with a clock signal, an upper m/2 bits of the first data, an upper m/2 bits of the second data, a lower m/2 bits of the first data, a lower m/2 bits of the second data, an upper m/2 bits of the third data, an upper m/2 bits of the fourth data, a lower m/2 bits of the third data, and a lower m/2 bits of the fourth data, in that order.

10. The memory device according to claim 5, further comprising
a data generation section that generates the second data, the third data, and the fourth data from the first data.

11. The memory device according to claim 5, further comprising
a first memory area for storing the first data, and a second memory area for storing the third data.

12. The memory device according to claim 5, further comprising:
a data generation section that generates the third data from the first data, and generates the fourth data from the second data.

13. The memory device according to claim 1, wherein
the host circuit and the memory device are adapted to be electrically connected via circuit-side terminals that are electrically connected to the host circuit, and memory-device-side terminals that are electrically connected to the memory device and detachably attachable to the circuit-side terminals.

14. A host circuit electrically connectable to the memory device according to claim 1, comprising:
a data reception section that receives the first data and the second data from the memory device; and
a determination section that determines whether the first data and the second data have the prescribed correlation.

15. A host circuit electrically connectable to the memory device according to claim 3, comprising:
a data reception section that receives the first data and the second data from the memory device; and
a determination section that outputs an affirmative determination result if an exclusive OR outcome of an m-th value of the first data and an m-th value in the second data is true for all the n bits where m is an integer such that $1 \leq m \leq n$; and outputs a negative determination result if the exclusive OR outcome is false for any one of the n bits.

16. A host circuit electrically connectable to the memory device according to claim 8, comprising:
a data reception section that receives the first data, the second data, the third data, and the fourth data from the memory device; and
a first determination section that carries out a first determination to output an affirmative determination result if an exclusive OR outcome of a k-th value of the first data and a k-th value of the fourth data is true for all the m bits where k is an integer such that $1 \leq k \leq m$, or to output a negative determination result if the exclusive OR outcome is false for any one of the m bits.

17. The host circuit according to claim 16, further comprising
a second determination section that carries out a second determination in instances where the determination result of the first determination is negative,
wherein the second determination section determines that an error has occurred in the nonvolatile data memory section of the memory device if an exclusive OR outcome of a k-th value of the first data and a k-th value of the second data is true for all the m bits, and also an exclusive OR outcome of a k-th value of the third data and a k-th value of the fourth data is true for all the m bits, and the second determination section determines that a communication error has occurred between the memory device and the host circuit if the exclusive OR outcome of the k-th value of the first data and the k-th value of the second data is false for any one of the m bits, or if the exclusive OR outcome of the k-th value of the third data and the k-th value of the fourth data is false for any one of the m bits.

18. A board detachably and electrically connectable to a liquid jetting apparatus, comprising:
a nonvolatile data memory section;
a read/write control section that reads a first data from the nonvolatile data memory section, the first data having a prescribed data amount; and
a data transmission section that transmits to the liquid jetting apparatus the first data together with second data, wherein the second data is different from the first data and has prescribed correlation with content of the first data, and is identical in size to the first data, the second data having an identical data amount to the data amount of the first data.

19. A liquid receptacle detachably installable in a liquid jetting apparatus, comprising:
a nonvolatile data memory section;
a read/write control section that reads a first data from the nonvolatile data memory section, the first data having a prescribed data amount; and
a data transmission section that transmits to the liquid jetting apparatus the first data together with second data, wherein the second data is different from the first data and has prescribed correlation with content of the first data, and is identical in size to the first data, the second data having an identical data amount to the data amount of the first data.

20. A method of transmitting data stored in a nonvolatile data memory section to a host circuit, comprising the steps of:
reading a first data from the nonvolatile data memory section, the first data having a prescribed data amount; and
transmitting to the host circuit the first data together with second data, wherein the second data is different from the first data and has prescribed correlation with content of the first data, and is identical in size to the first data, the second data having an identical data amount to the data amount of the first data.

21. A system comprising a host circuit and a memory device electrically connectable to the host circuit, wherein
the memory device includes:
a nonvolatile data memory section;
a read/write control section that reads a first data from the nonvolatile data memory section, the first data having a prescribed data amount; and
a data transmission section that transmits to the host circuit the first data together with second data, wherein the second data is different from the first data and has prescribed correlation with content of the first data, and is identical in size to the first data, the second data having an identical data amount to the data amount of the first data,
and the host circuit includes:
a data reception section that receives the first data and the second data from the memory device; and
a determination section that determines whether the first data and the second data have the prescribed correlation.

* * * * *